(12) United States Patent
Nagata et al.

(10) Patent No.: US 10,804,312 B2
(45) Date of Patent: Oct. 13, 2020

(54) SEMICONDUCTOR DEVICE AND ELECTRONIC DEVICE HAVING A CHIP SIZE PACKAGE (CSP)

(71) Applicant: SONY CORPORATION, Tokyo (JP)

(72) Inventors: Masaya Nagata, Kanagawa (JP); Kaori Takimoto, Kanagawa (JP)

(73) Assignee: Sony Corporation, Toyko (JP)

( * ) Notice: Subject to any disclaimer, the term of this patent is extended or adjusted under 35 U.S.C. 154(b) by 0 days.

(21) Appl. No.: 16/516,785

(22) Filed: Jul. 19, 2019

(65) Prior Publication Data

US 2019/0341417 A1 Nov. 7, 2019

Related U.S. Application Data

(63) Continuation of application No. 15/580,552, filed as application No. PCT/JP2016/066348 on Jun. 2, 2016, now Pat. No. 10,403,669.

(30) Foreign Application Priority Data

Jun. 15, 2015 (JP) .................................. 2015-120302

(51) Int. Cl.
*H01L 27/14* (2006.01)
*H01L 23/28* (2006.01)
(Continued)

(52) U.S. Cl.
CPC ...... *H01L 27/14634* (2013.01); *H01L 21/563* (2013.01); *H01L 23/28* (2013.01);
(Continued)

(58) Field of Classification Search
CPC .............. H01L 27/14634; H01L 27/14; H01L 27/14618; H01L 27/14636; H01L 27/1469; H01L 23/23; H01L 23/29; H01L 23/31; H01L 23/3114; H01L 23/3142; H01L 23/3157; H01L 23/562; H01L 24/05; H01L 24/32; H01L 25/065; H01L 25/07; H01L 25/18; H01L 23/28; H01L 21/563; H01L 2224/73204
See application file for complete search history.

(56) References Cited

U.S. PATENT DOCUMENTS

| 6,514,847 B1 * | 2/2003 | Ohsawa | H01L 23/24 |
| | | | 438/614 |
| 6,623,178 B1 * | 9/2003 | Sakurai | G02B 6/4201 |
| | | | 385/88 |

(Continued)

*Primary Examiner* — Ida M Soward
(74) *Attorney, Agent, or Firm* — Sheridan Ross P.C.

(57) ABSTRACT

The present disclosure relates to a semiconductor device, an electronic device, and a manufacturing method that can maintain the mounting reliability of an underfill. A chip is formed by a circuit 5 of an imaging element being produced on a Si substrate that is a first substrate and a second substrate being produced on an adhesive formed on the circuit. In this event, a photosensitive material is formed around the chip after the chip is mounted on a mounting substrate by a solder ball or in the state of the chip, then an underfill is formed, and then only the photosensitive 10 material is dissolved. The present disclosure can be applied to, for example, a CMOS solid-state imaging sensor used for an imaging device such as a camera.

12 Claims, 29 Drawing Sheets

(51) Int. Cl.

| | | |
|---|---|---|
| *H01L 23/29* | (2006.01) | |
| *H01L 23/31* | (2006.01) | |
| *H01L 25/065* | (2006.01) | |
| *H01L 25/07* | (2006.01) | |
| *H01L 25/18* | (2006.01) | |
| *H01L 21/56* | (2006.01) | |
| *H01L 27/146* | (2006.01) | |
| *H01L 23/00* | (2006.01) | |
| *H01L 25/11* | (2006.01) | |
| *H01L 25/04* | (2014.01) | |
| *H01L 25/075* | (2006.01) | |
| *H01L 23/48* | (2006.01) | |
| *H01L 21/768* | (2006.01) | |
| *H01L 21/78* | (2006.01) | |

(52) U.S. Cl.
CPC ............. *H01L 23/29* (2013.01); *H01L 23/31* (2013.01); *H01L 23/3114* (2013.01); *H01L 23/3142* (2013.01); *H01L 23/3157* (2013.01); *H01L 23/562* (2013.01); *H01L 24/05* (2013.01); *H01L 24/32* (2013.01); *H01L 25/065* (2013.01); *H01L 25/07* (2013.01); *H01L 25/18* (2013.01); *H01L 27/14* (2013.01); *H01L 27/1469* (2013.01); *H01L 27/14618* (2013.01); *H01L 27/14636* (2013.01); *H01L 21/76898* (2013.01); *H01L 21/78* (2013.01); *H01L 23/481* (2013.01); *H01L 24/11* (2013.01); *H01L 24/16* (2013.01); *H01L 24/73* (2013.01); *H01L 24/81* (2013.01); *H01L 24/83* (2013.01); *H01L 24/92* (2013.01); *H01L 24/94* (2013.01); *H01L 25/043* (2013.01); *H01L 25/0657* (2013.01); *H01L 25/074* (2013.01); *H01L 25/0756* (2013.01); *H01L 25/117* (2013.01); *H01L 27/14632* (2013.01); *H01L 27/14643* (2013.01); *H01L 27/14687* (2013.01); *H01L 2224/05025* (2013.01); *H01L 2224/131* (2013.01); *H01L 2224/16225* (2013.01); *H01L 2224/16227* (2013.01); *H01L 2224/32145* (2013.01); *H01L 2224/32225* (2013.01); *H01L 2224/33181* (2013.01); *H01L 2224/73204* (2013.01); *H01L 2224/73253* (2013.01); *H01L 2224/81815* (2013.01); *H01L 2224/92225* (2013.01); *H01L 2224/92242* (2013.01); *H01L 2224/94* (2013.01); *H01L 2924/35121* (2013.01)

(56) References Cited

U.S. PATENT DOCUMENTS

| | | | |
|---|---|---|---|
| 6,861,290 B1 * | 3/2005 | Moden | H01L 23/3128 |
| | | | 438/118 |
| 7,582,510 B2 | 9/2009 | Todd et al. | |
| 7,829,992 B2 * | 11/2010 | Sugino | H01L 23/16 |
| | | | 257/686 |
| 7,851,893 B2 | 12/2010 | Kim et al. | |
| 8,125,066 B1 * | 2/2012 | Kang | H01L 21/565 |
| | | | 257/685 |
| 8,288,849 B2 * | 10/2012 | Wachtler | H01L 23/49816 |
| | | | 257/678 |
| 8,389,339 B2 * | 3/2013 | Tanuma | H01L 21/563 |
| | | | 438/107 |
| 8,409,917 B2 | 4/2013 | Yoon et al. | |
| 8,587,096 B2 | 11/2013 | Kim et al. | |
| 9,035,442 B2 * | 5/2015 | Kawabata | H01L 23/49838 |
| | | | 257/686 |
| 9,067,272 B2 * | 6/2015 | Sutanto | B23K 1/008 |
| 9,356,002 B2 * | 5/2016 | Im | H01L 23/49541 |
| 2005/0090050 A1 | 4/2005 | Shim et al. | |
| 2005/0218528 A1 * | 10/2005 | Beatty | H01L 21/563 |
| | | | 257/778 |
| 2005/0287706 A1 | 12/2005 | Fullet et al. | |
| 2006/0079023 A1 | 4/2006 | Fukuda et al. | |
| 2007/0096291 A1 * | 5/2007 | Kawabata | H01L 25/105 |
| | | | 257/700 |
| 2008/0142944 A1 * | 6/2008 | Oi | H01L 25/105 |
| | | | 257/686 |
| 2009/0008765 A1 * | 1/2009 | Yamano | H01L 24/83 |
| | | | 257/690 |
| 2009/0174081 A1 * | 7/2009 | Furuta | H01L 23/49838 |
| | | | 257/777 |
| 2009/0291528 A1 | 11/2009 | Do et al. | |
| 2012/0153468 A1 | 6/2012 | Lee | |
| 2012/0223433 A1 | 9/2012 | Jee et al. | |
| 2012/0267783 A1 * | 10/2012 | Liu | H01L 25/105 |
| | | | 257/738 |
| 2014/0021605 A1 * | 1/2014 | Yu | H01L 25/50 |
| | | | 257/738 |
| 2014/0213017 A1 | 7/2014 | Kim et al. | |
| 2014/0327138 A1 | 11/2014 | Miyamoto | |
| 2015/0130083 A1 | 5/2015 | Park et al. | |

\* cited by examiner

SEMICONDUCTOR DEVICE AND ELECTRONIC DEVICE HAVING A CHIP SIZE PACKAGE (CSP)

CROSS REFERENCE TO RELATED APPLICATIONS

This application is a continuation of U.S. patent application Ser. No. 15/580,552, filed Dec. 7, 2017, which is a national stage application under 35 U.S.C. 371 and claims the benefit of PCT Application No. PCT/JP2016/066348 having an international filing date of Jun. 2, 2016, which designated the United States, which PCT application claimed the benefit of Japanese Patent Application No. 2015-120302 filed Jun. 15, 2015, the disclosures of which are incorporated herein by reference in their entirety.

TECHNICAL FIELD

The present disclosure relates to a semiconductor device, an electronic device, and a manufacturing method, and relates particularly to a semiconductor device, an electronic device, and a manufacturing method that can maintain the mounting reliability of an underfill.

BACKGROUND ART

In the mounting process of a flip chip, an underfill resin (UF resin) is put between a chip and a substrate in order to improve mounting reliability. The UF resin usually creeps up the side surface of the chip, and therefore there has been a concern that damage to the chip end is caused.

Thus, the damage to the chip end has so far been prevented by adding an elastic body to the side surface to adjust stress (see Patent Literature 1).

CITATION LIST

Patent Literature

Patent Literature 1: JP 2002-141444A

DISCLOSURE OF INVENTION

Technical Problem

However, in a chip size package (CSP) of a CMOS image sensor (CIS), for example, glass and Si bonded together by a resin appear on the end surface, and there has been a concern that the elastic body breaks the structure including the resin.

Further, in a CIS CSP, a flat surface does not appear out, and there has been a concern that the elastic body peels off The present disclosure has been made in view of such circumstances, and can maintain the mounting reliability of an underfill.

Solution to Problem

According to an aspect of the present disclosure, a semiconductor device includes: a chip size package (CSP) composed of a first substrate in which a circuit is formed, a second substrate made of a material different from the first substrate, and a bonding unit configured to bond the second substrate onto the first substrate; and a mounting substrate configured to mount the CSP. The CSP is formed in a structure in which an underfill used at a time of being mounted on the mounting substrate is prevented from adhering to a side wall of the second substrate.

The CSP is formed in a structure in which the underfill is prevented from adhering to a part or substantially a whole of a side wall of the CSP.

The CSP is formed in a structure in which a photosensitive material formed on a part or substantially a whole of a side wall of the CSP is removed and thereby the underfill is prevented from adhering to the part or substantially the whole of the side wall of the CSP.

The CSP is formed in a structure in which a hydrophobic material is formed on a part or substantially a whole of a side wall of the CSP and thereby the underfill is prevented from adhering to the part or substantially the whole of the side wall of the CSP.

One or a plurality of concavities/convexities are formed on a part of a side wall of the first substrate and thereby the CSP is formed in a structure in which the underfill is prevented from adhering to the side wall of the second substrate.

A through hole for exposing a bottom surface of the first substrate and making a connection to a connection pad of the circuit is opened, an insulating film of the first substrate is deposited, then the connection pad is exposed, a reinterconnection is formed, then a creeping-up prevention pattern is formed, an insulating film unit is formed, then the creeping-up prevention pattern is removed, a concavity is formed on the insulating film unit, and thereby one or a plurality of concavities/convexities are formed on a part or substantially a whole of a side wall of the first substrate.

The creeping-up prevention pattern is arranged to stretch across a place where fragmentation is to be performed.

A through hole for exposing a bottom surface of the first substrate and making a connection to a connection pad of the circuit is opened, an insulating film of the first substrate is deposited, then the connection pad is exposed, a reinterconnection is formed, then an insulating film unit is formed, the first substrate is opened, then processing of recessing the first substrate is performed, and thereby one or a plurality of concavities-/convexities are formed on a part or substantially a whole of a side wall of the first substrate.

A recessed portion of the first substrate is arranged to stretch across a place where fragmentation is to be performed.

An imaging element and a logic circuit are formed as the circuit in the first substrate, a through hole for exposing a bottom surface of the first substrate and making a connection to a connection pad of the circuit is opened, an insulating film of the first substrate is deposited, then the connection pad is exposed, a reinterconnection is formed, then an insulating film unit is formed, an interlayer insulating film of the logic circuit is opened, then processing of recessing the interlayer insulating film of the logic circuit from a cap film is performed, and thereby one or a plurality of concavities/convexities are formed on a part or substantially a whole of a side wall of an interconnection layer of the logic circuit.

A recessed portion of the interlayer insulating film of the logic circuit is arranged to stretch across a place where fragmentation is to be performed.

In a manufacturing method according to an aspect of the present technology, a manufacturing apparatus forms a chip size package (CSP) composed of a first substrate in which a circuit is formed, a second substrate made of a material different from the first substrate, and a bonding unit configured to bond the second substrate onto the first substrate, in a structure in which an underfill used at a time of being mounted on a mounting substrate for mounting the CSP is prevented from adhering to a side wall of the second substrate.

According to an aspect of the present disclosure, an electronic device includes: a chip size package (CSP) composed of a first substrate in which a circuit is formed, a second substrate made of a material different from the first substrate, and a bonding unit configured to bond the second substrate onto the first substrate; and a mounting substrate configured to mount the CSP. The CSP includes a solid-state imaging sensor formed in a structure in which an underfill used at a time of being mounted on the mounting substrate is prevented from adhering to a side wall of the second substrate, a signal processing circuit configured to process an output signal outputted from the solid-state imaging sensor, and an optical system configured to cause incident light to be incident on the solid-state imaging sensor.

According to an aspect of the present disclosure, a chip size package (CSP) composed of a first substrate in which a circuit is formed, a second substrate made of a material different from the first substrate, and a bonding unit configured to bond the second substrate onto the first substrate is formed in a structure in which an underfill used at a time of being mounted on the mounting substrate is prevented from adhering to a side wall of the second substrate.

Advantageous Effects of Invention

According to the present technology, the mounting reliability of an underfill can be maintained.

The advantageous effects described in the present specification are merely exemplary and the advantageous effects of the present technology are not limited to the advantageous effects described in the present specification, but there may be additional advantageous effects.

MODE(S) FOR CARRYING OUT THE INVENTION

Hereinbelow, embodiments for implementing the present disclosure (hereinafter referred to as embodiments) are described. In addition, the description is given in the following order.
1. First Embodiment
2. Second Embodiment
3. Third embodiment (usage examples of image sensor)
4. Fourth embodiment (example of electronic device)

1. First Embodiment

Example of Rough Configuration of Solid-State Imaging Sensor

Figure 1:
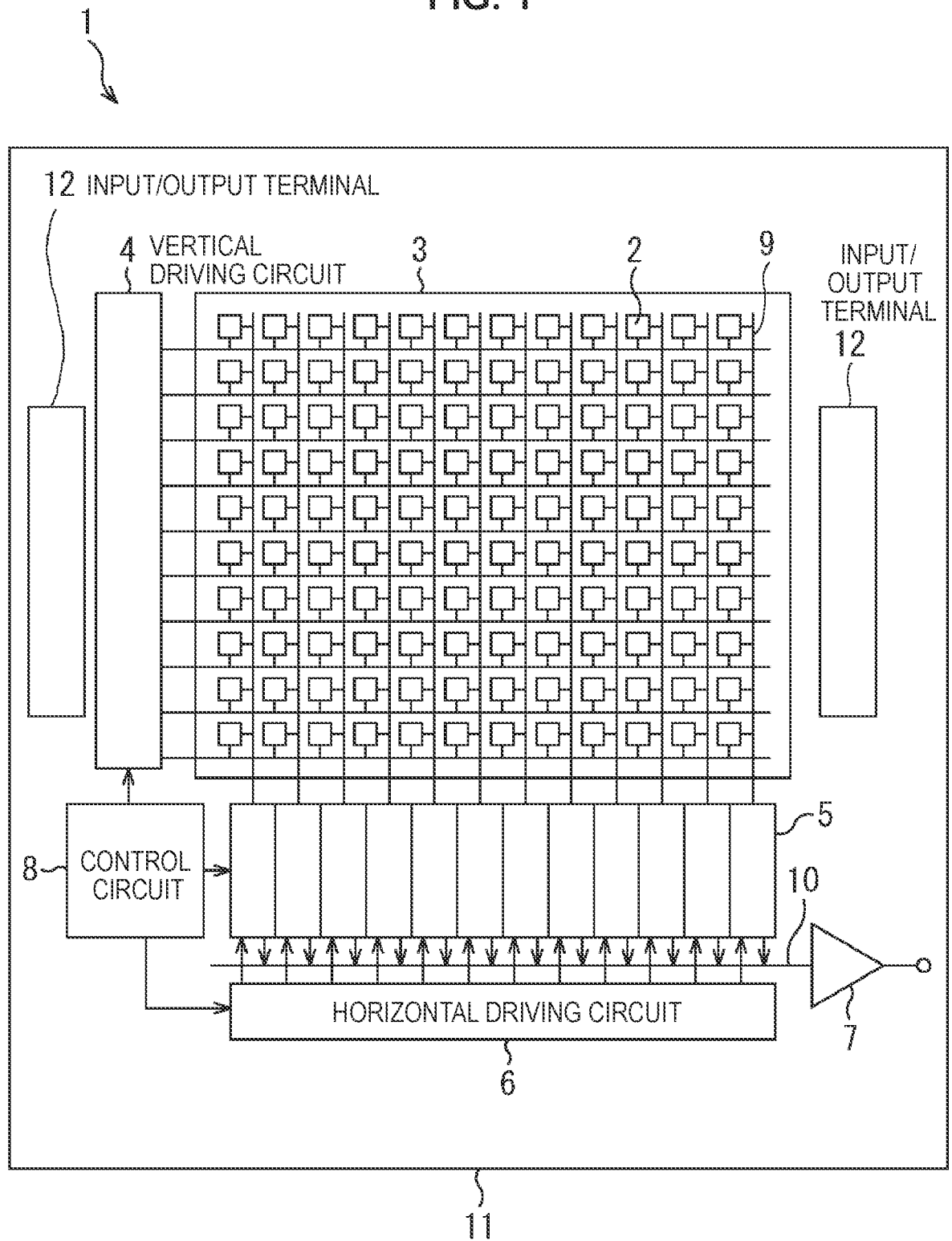
FIG. 1 is a block diagram showing an example of the rough configuration of a solid-state imaging sensor to which the present technology is applied.

FIG. 1 shows an example of the rough configuration of an example of a complementary metal oxide semiconductor (CMOS) solid-state imaging sensor used in each embodiment of the present technology.

As shown in FIG. 1, a solid-state imaging sensor (element chip) 1 is configured to include a pixel area (what is called an imaging area) 3 in which a plurality of pixels 2 including a photoelectric conversion element are two-dimensionally arranged in a regular manner on a semiconductor substrate 11 (for example, a silicon substrate) and a peripheral circuit unit.

The pixel 2 includes a photoelectric conversion element (for example, a photodiode) and a plurality of pixel transistors (what is called MOS transistors). The plurality of pixel transistors may be configured with, for example, three transistors of a transfer transistor, a reset transistor, and an amplification transistor, or may be configured with four transistors by further adding a selection transistor. An equivalent circuit of each pixel 2 (unit pixel) is similar to a common one, and therefore a detailed description is omitted herein.

Further, the pixel 2 may have a pixel-shared structure. The pixel-shared structure is configured from a plurality of photodiodes, a plurality of transfer transistors, one shared floating diffusion, and other shared one-by-one pixel transistors. The photodiode is a photoelectric conversion element.

The peripheral circuit unit is configured from a vertical driving circuit 4, a column signal processing circuit 5, a horizontal driving circuit 6, an output circuit 7, and a control circuit 8.

The control circuit 8 receives an input clock and data of commanding the operating mode etc., and further outputs data of inside information etc. of the solid-state imaging sensor 1. Specifically, the control circuit 8 generates a clock signal and a control signal serving as a standard of the operation of the vertical driving circuit 4, the column signal processing circuit 5, and the horizontal driving circuit 6 on the basis of a vertical synchronization signal, a horizontal synchronization signal, and a master clock. Then, the control circuit 8 inputs these signals to the vertical driving circuit 4, the column signal processing circuit 5, and the horizontal driving circuit 6.

The vertical driving circuit 4 is configured with, for example, a shift register; and selects a pixel driving interconnection and supplies a pulse for driving the pixel 2 to the selected pixel driving interconnection, and drives the pixel 2 on a row basis. Specifically, the vertical driving circuit 4 selectively scans each pixel 2 in the pixel area 3 sequentially in the vertical direction on a row basis, and supplies the column signal processing circuit 5 with, via a vertical signal line 9, a pixel signal based on a signal charge generated in accordance with the amount of received light in the photoelectric conversion element of each pixel 2.

The column signal processing circuit 5 is arranged for each column of pixels 2, for example, and performs signal processing such as denoising on the signal outputted from the pixel 2 of one row for each pixel column. Specifically, the column signal processing circuit 5 performs signal processing such as correlated double sampling (CDS) for removing fixed pattern noise peculiar to the pixel 2, signal amplification, and analog/digital (A/D) conversion. On the output stage of the column signal processing circuit 5, a horizontal selection switch (not illustrated) is provided to be connected to a part leading to a horizontal signal line 10.

The horizontal driving circuit 6 is configured with, for example, a shift register; and sequentially selects each of the column signal processing circuits 5 by sequentially outputting a horizontal scanning pulse, and causes a pixel signal to be outputted from each of the column signal processing circuits 5 to the horizontal signal line 10.

The output circuit 7 performs signal processing on the signal sequentially supplied from each of the column signal processing circuits 5 via the horizontal signal line 10 and outputs the processed signal. The output circuit 7 may perform only buffering, or may perform black level adjustment, column variation correction, various pieces of digital signal processing, etc., for example.

Input/output terminals 12 are provided in order to exchange signals with the outside.

<CPS Structure of Present Technology>

Figure 2:
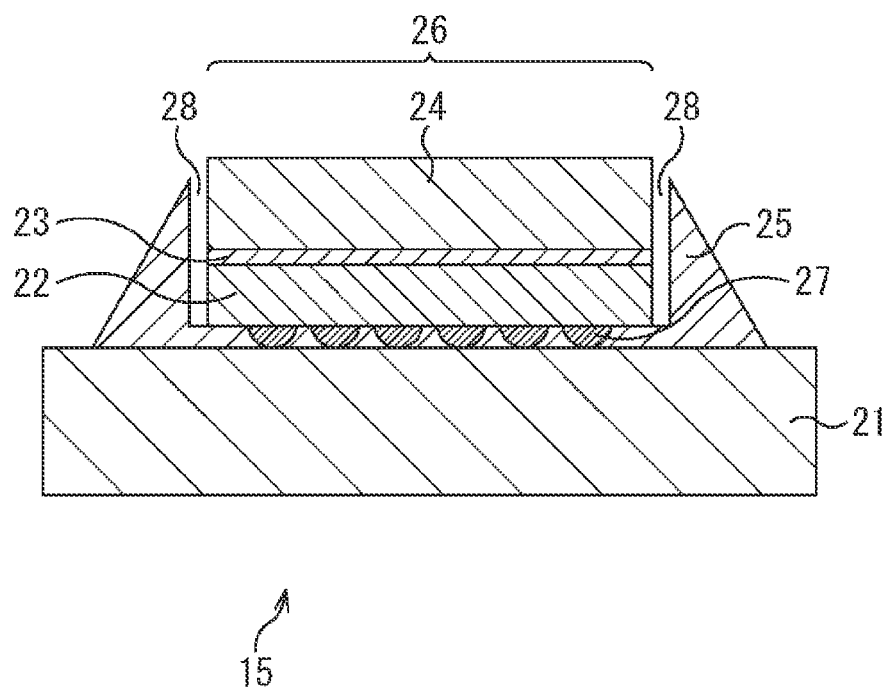
FIG. 2 is a cross-sectional view showing an example of the structure of a CPS of an imaging element of the present technology.

FIG. 2 is a cross-sectional view showing an example of the structure of a chip scale package (CPS) of an imaging element of the present technology.

In a CPS 15, a chip (semiconductor element) 26 is mounted on a mounting substrate 21 by solder balls 27, and then an underfill 25 is put between the chip 26 and the mounting substrate 21. Then, a space 28 is formed between an end of the chip 26 and the underfill 25.

The chip 26 is formed by, for example, a circuit of an imaging element being produced on a Si substrate 22 that is a first substrate and a second substrate 24 being produced on an adhesive 23 formed on the circuit. In addition, the circuit may be a circuit of something other than an imaging element.

In this event, a photosensitive material (a photosensitive material 31 of B of FIG. 6) is formed around the chip 26 after the chip 26 is mounted on the mounting substrate 21 by the solder balls 27 or in the state of the chip 26, then the underfill 25 is formed, and then only the photosensitive material is dissolved.

Thereby, the space 28 where the underfill 25 cannot be formed is formed between an end portion of the chip 26 and the underfill 25, and therefore the underfill 25 having adhesiveness is not formed at the end of the chip 26. That is, little or no underfill 25 is adhered to the side wall of the CPS 15. Therefore, a situation where the expansion and contraction of the underfill 25 adhered to the mounting substrate 21 influences the end of the chip 26 can be avoided.

<Manufacturing Processing of CPS of Present Technology>

Figure 3:
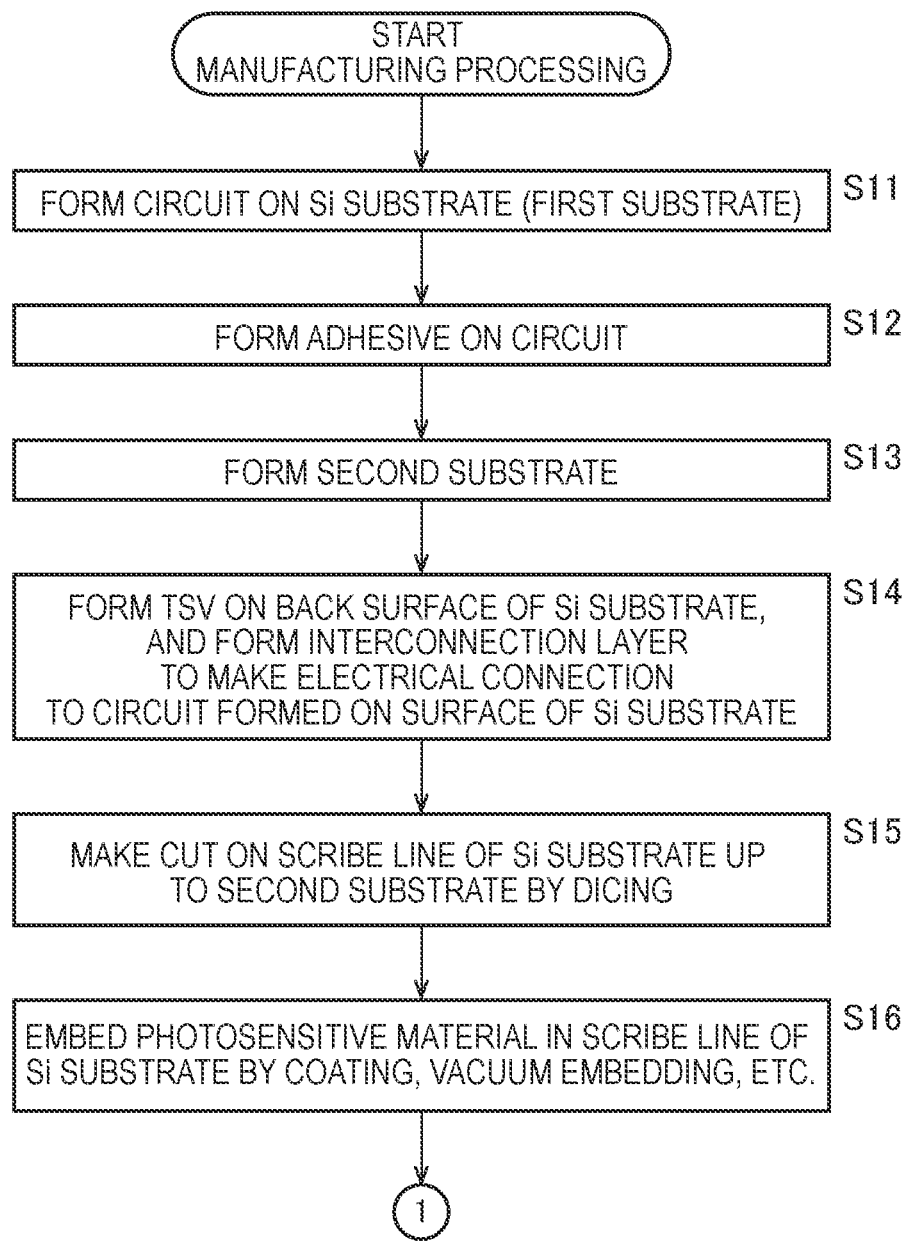
FIG. 3 is a flow chart describing the manufacturing processing of the CPS of FIG. 2.
Figure 4:
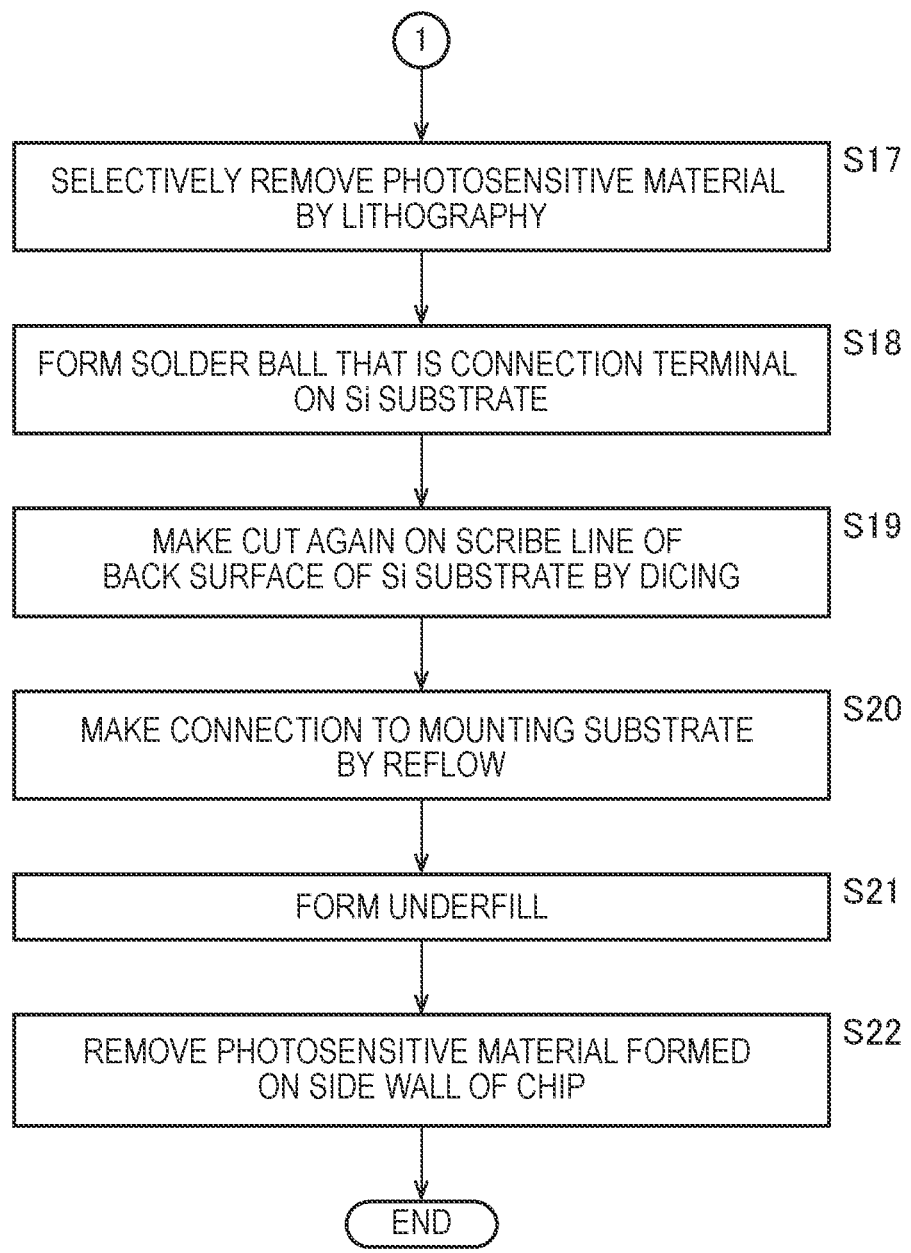
FIG. 4 is a flow chart describing the manufacturing processing of the CPS of FIG. 2.

Next, the manufacturing processing of the CPS 15 of FIG. 2 is described with reference to the flow charts of FIG. 3 and FIG. 4. In addition, this description refers to also the process diagrams of FIG. 5 to FIG. 8.

In step S11, the manufacturing apparatus prepares the Si substrate 22 (A of FIG. 5), and produces a prescribed circuit (a circuit of an imaging element or the like) on the Si substrate 22.

In step S12, the manufacturing apparatus forms the adhesive 23 (B of FIG. 5) on the produced circuit. The adhesive 23 is a resin such as an acrylic-, epoxy-, or silicon-based resin, a composite resin of these, or the like, and the type is not limited. The film thickness may be approximately 5 to 100 um. If it is too thin, the adhesive strength and the total thickness variation (TTV) of the Si substrate cannot be provided; further, if it is too thick, it is difficult to control wafer warpage and the tilt etc. of the second substrate to be bonded later.

Figure 5:
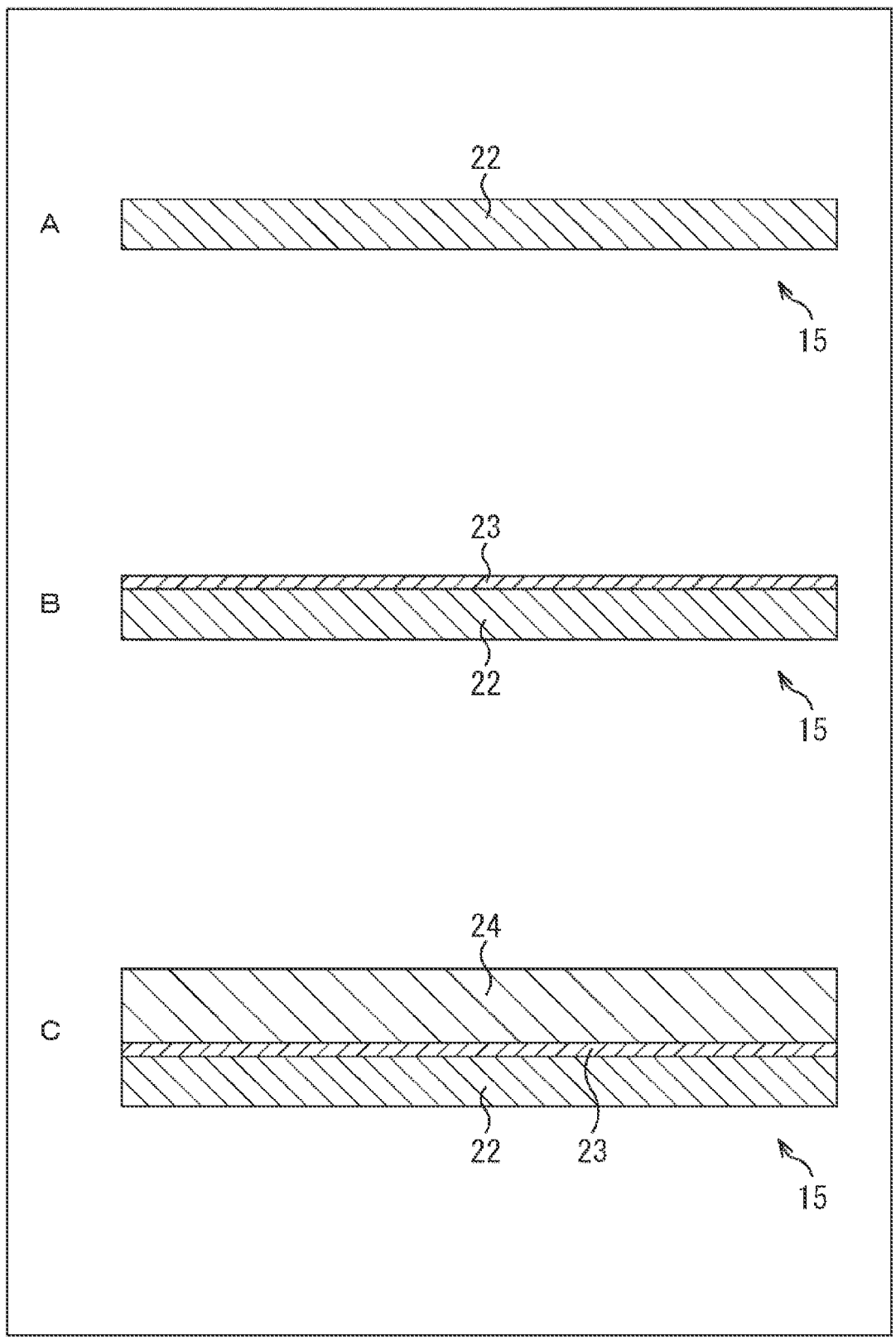
FIG. 5 is a diagram showing an example of the process of the manufacturing processing of the CPS of FIG. 2.

In step S13, as shown in C of FIG. 5, the manufacturing apparatus forms the second substrate 24 (for example, glass, or an acrylic transparent hardenable resin, quartz, Si, or the like) on the adhesive 23. In step S14, although the process is not illustrated, the manufacturing apparatus forms through-silicon vias (TSVs) on the back surface of the Si substrate 22, forms an interconnection layer, and makes an electrical connection to the circuit formed on the Si substrate 22.

In step S15, the manufacturing apparatus makes cuts 30 (A of FIG. 6) on scribe lines of the back surface of the Si substrate 22 by dicing. This is usually performed by dicing using a blade. The dicing is in order to physically provide a space (the cut 30) on the scribe line; and the method for providing a space on the scribe line may be also dry etching, wet etching, laser ablation, etc., but is not limited to these. The dicing width depends on the width of the scribe line, and is usually 40 to 200 um.

Further, the depth of dicing may be at a level at which the first substrate (the Si substrate 22) and the second substrate 24 are not damaged at a wafer level during handling. The manufacturing apparatus usually leaves 100 to 300 um of the second substrate 24 or further temporarily adheres a support substrate (not illustrated) onto the second substrate 24, and fully cuts the second substrate 24.

Figure 6:
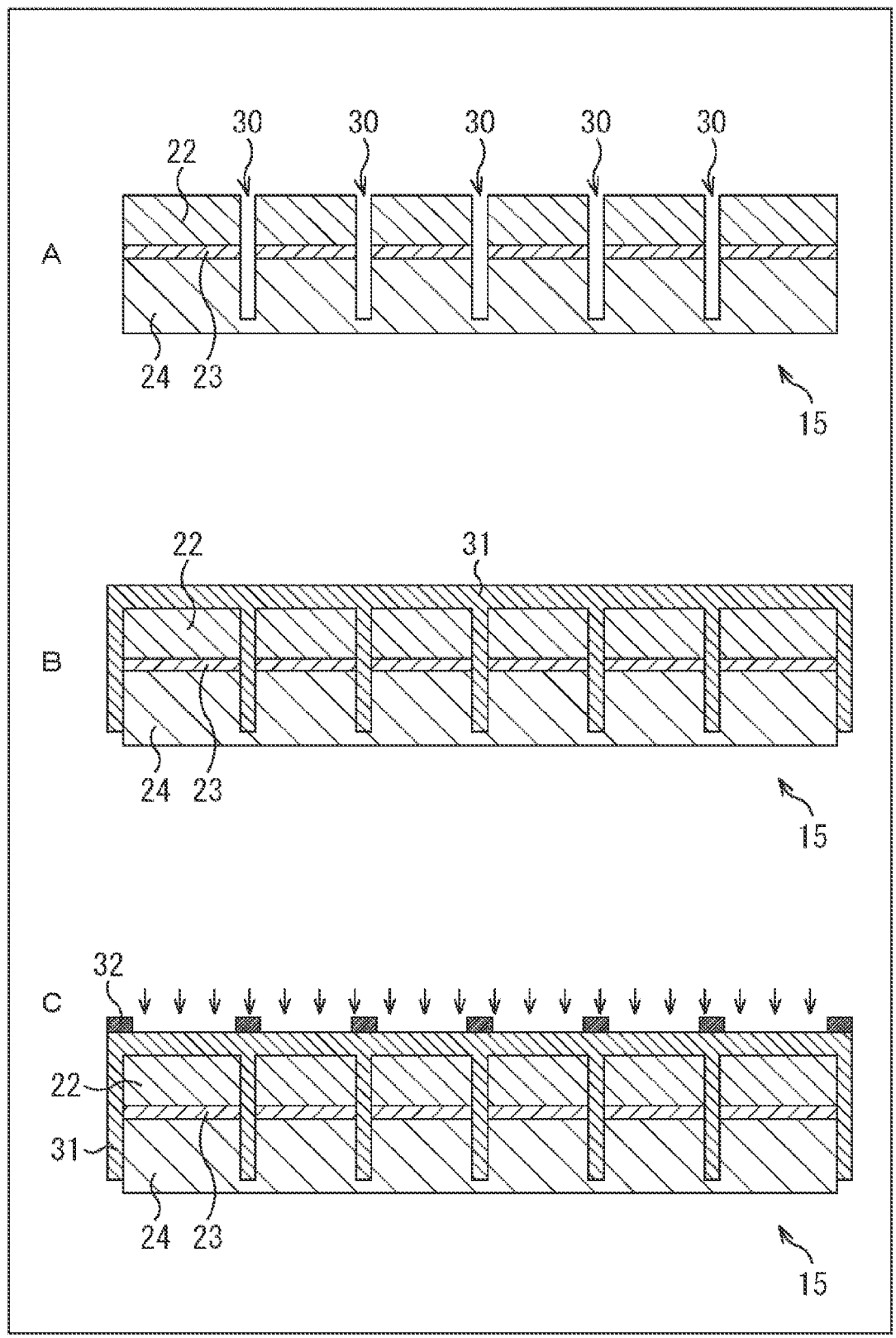
FIG. 6 is a diagram showing an example of the process of the manufacturing processing of the CPS of FIG. 2.

In step S16, as shown in B of FIG. 6, the manufacturing apparatus embeds a photosensitive material 31 (for example, a photosensitive resist, a photosensitive insulating material, a photosensitive resin, or the like) into the cut 30 of the scribe line on the Si substrate 22 by a method such as coating or vacuum embedding. The photosensitive material 31 is formed also on the Si substrate 22.

Figure 7:
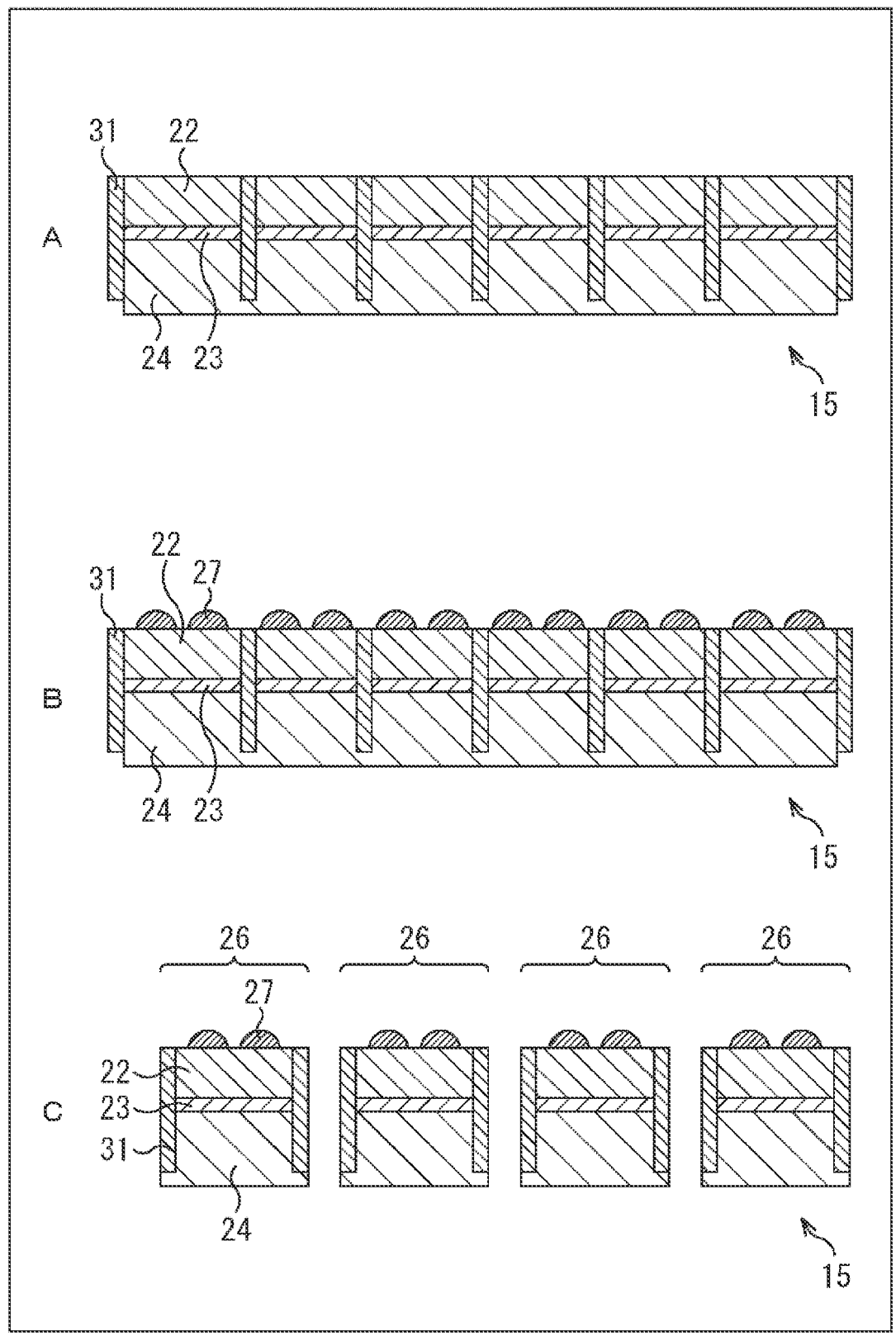
FIG. 7 is a diagram showing an example of the process of the manufacturing processing of the CPS of FIG. 2.

In step S17, as shown in A of FIG. 7, the manufacturing apparatus selectively removes the photosensitive material 31 by lithography 32 (C of FIG. 6) in order to leave the photosensitive material 31 on the scribe line. In addition, although the photosensitive material 31 is used in step S15, also a resin soluble in a chemical liquid or the like is possible, and in this case it is possible to not perform lithography but remove the entire surface of the second substrate 24 by plasma processing or the like.

In addition, in step S17, methods such as whether to selectively leave the photosensitive material 31 on the scribe line by lithography 32 or selectively leave the photosensitive material 31 by plasma processing are not questioned. It is important to leave the photosensitive material 31 exclusively on the scribe line.

In step S18, the manufacturing apparatus forms solder balls 27 (B of FIG. 7) that are connection terminals on the Si substrate 22. Here, in order to remove the photosensitive material 31 by later wet cleaning or dry cleaning, temperature application by which the photosensitive material 31 is not altered during the formation of the solder ball 27 is necessary. For example, the temperature is set to 250 degrees or less. Other values are possible depending on the heat-resistant temperature of the photosensitive material 31.

In step S19, the manufacturing apparatus makes cuts again on the scribe lines (the cuts 30 of the scribe lines) of the back surface of the Si substrate 22 by dicing. Usually dicing using a blade is performed. The dicing is in order to separate each chip; and the method is not limited to this, and besides this, dry etching, wet etching, laser ablation, etc. are used, for example.

The dicing width depends on the width of the scribe line and is not limited; but is usually 40 to 200 um. As shown in C of FIG. 7, also the second substrate 24 is completely separated for each chip 26 by this dicing. In this event, the photosensitive material 31 of the side wall of the chip 26 is left.

Figure 8:
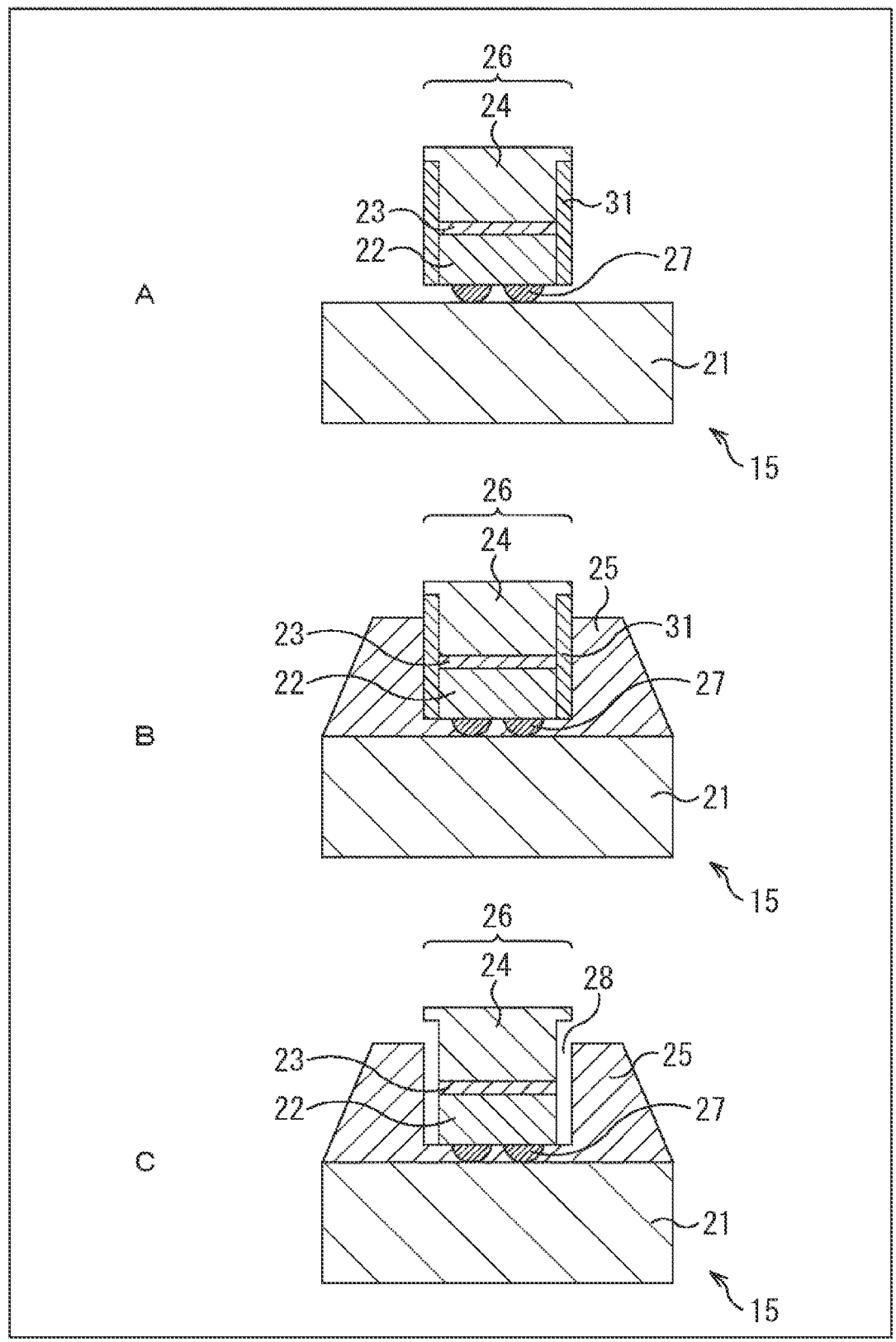
FIG. 8 is a diagram showing an example of the process of the manufacturing processing of the CPS of FIG. 2.

In step S20, as shown in A of FIG. 8, the manufacturing apparatus connects the chip 26 to the mounting substrate 21 by reflow. Here, in order to remove the photosensitive material 31 by later wet cleaning or dry cleaning, temperature application by which the photosensitive material 31 is not altered during reflow is necessary like during the formation of the solder ball 27.

In step S21, the manufacturing apparatus forms the underfill 25 (B of FIG. 8) in order to fix the chip 26 to the mounting substrate 21 stably. The underfill 25 is formed in conditions in which it does not reach the surface of the second substrate 24. Here, in order to remove the photosensitive material 31 by later wet cleaning or dry cleaning, temperature application by which the photosensitive material 31 is not altered during the formation of the underfill 25 is necessary like during the formation of the solder ball 27.

In step S22, the manufacturing apparatus removes the photosensitive material 31 formed on the side wall of the chip 26 by a solvent or plasma processing.

Thereby, as shown in C of FIG. 8, the space 28 where the underfill 25 cannot be formed is formed on a side wall portion of the chip 26, and the bottom surface of the chip 26 (the surface of the solder ball 27) is fixed stably; therefore, the original function of the underfill 25 is not impaired, and the peeling-off of the side wall of the chip 26 can be suppressed.

<CPS Structure of Present Technology>

Figure 9:
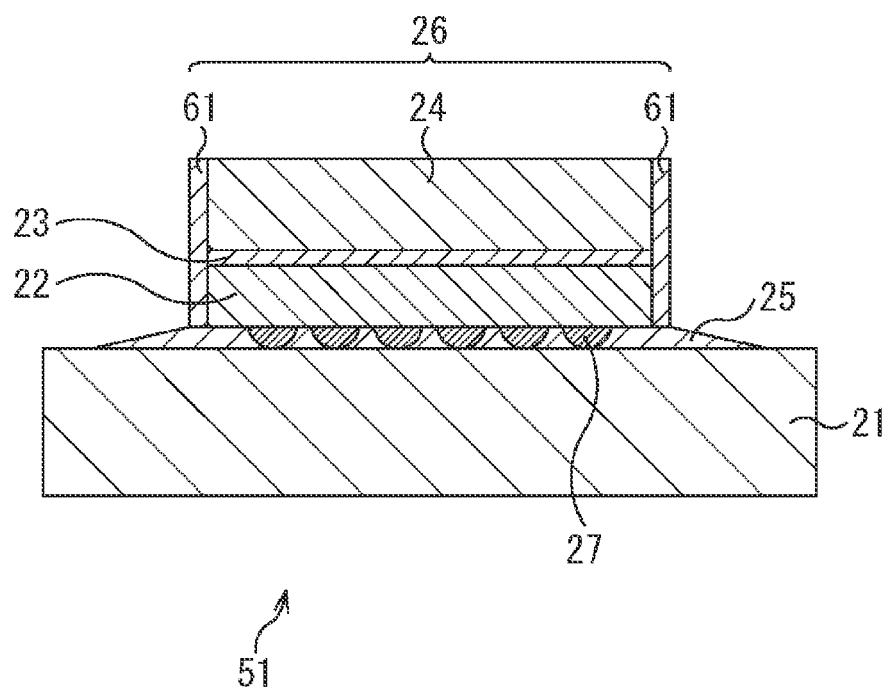
FIG. 9 is a cross-sectional view showing another example of the structure of the CPS of FIG. 2.

FIG. 9 is a cross-sectional view showing another example of the structure of a chip scale package (CPS) of the imaging element of FIG. 2. In addition, in the example of FIG. 9, portions corresponding to the example of FIG. 2 are marked with the corresponding reference signs.

In a CPS 51, a hydrophobic material 61 is formed on the side wall of the chip 26 after the chip 26 is mounted on the mounting substrate 21 by solder balls 27 or in the state of the chip 26. Then, the underfill 25 is formed between the bottom surface of the chip 26 (the surface of the solder ball 27) and the mounting substrate 21.

The chip 26 is formed by, similarly to the CPS 15 of FIG. 2, a circuit of an imaging element being produced on the Si substrate 22 that is the first substrate and the second substrate 24 being produced on the adhesive 23 formed on the circuit.

In this event, the hydrophobic material 61 is formed around the chip 26 after the chip 26 is mounted on the mounting substrate 21 by the solder balls 27 or in the state of the chip 26, and then the underfill 25 is formed on the bottom surface the chip 26.

Thereby, the hydrophobic material 61 is formed on an end portion of the chip 26, and therefore the underfill 25 having adhesiveness is not formed at the chip end. That is, little or no underfill 25 is adhered to the side wall of the CPS 51. Therefore, a situation where the expansion and contraction of the underfill 25 adhered to the substrate influences the chip end can be avoided.

<Manufacturing Processing of CPS of Present Technology>

Figure 10:
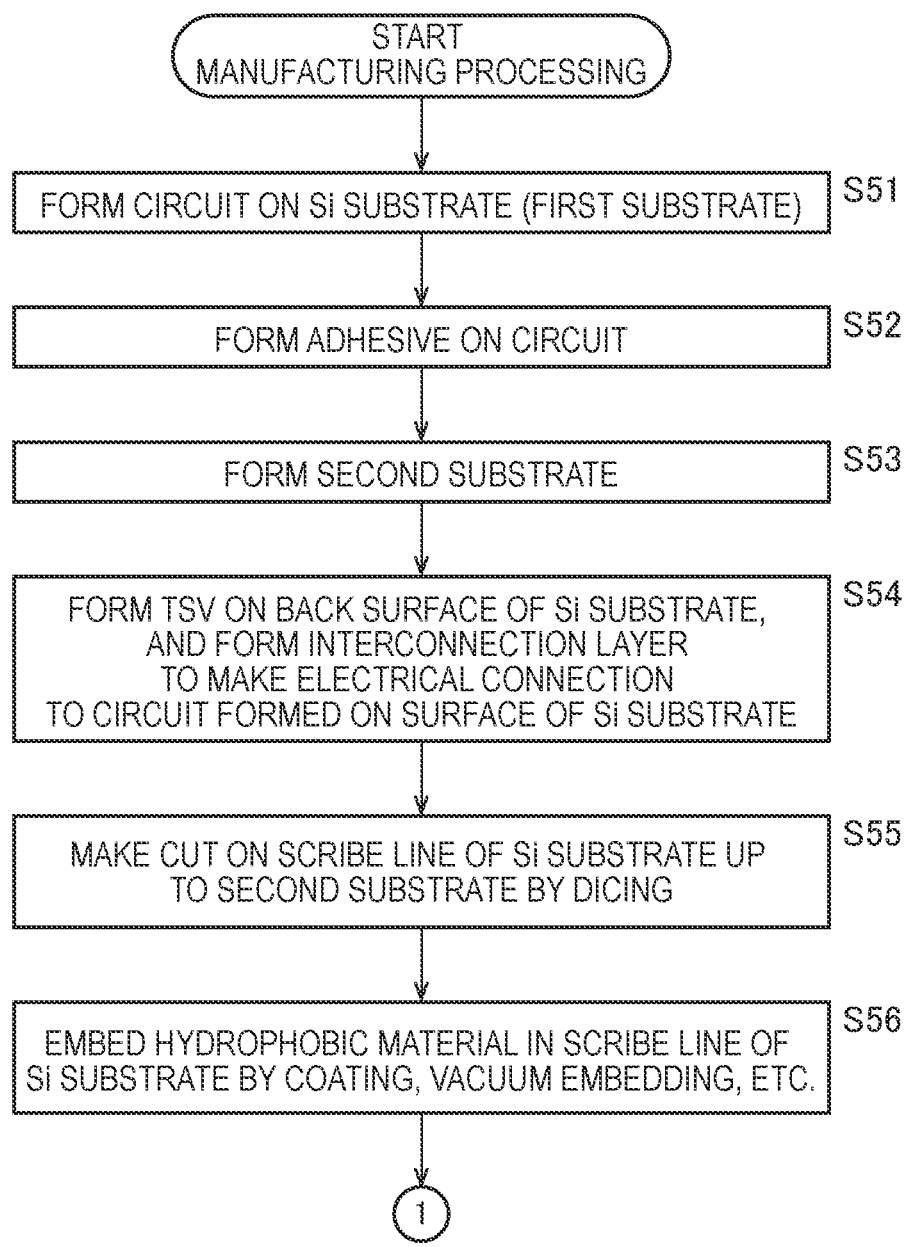
FIG. 10 is a flow chart describing the manufacturing processing of the CPS of FIG. 9.
Figure 11:
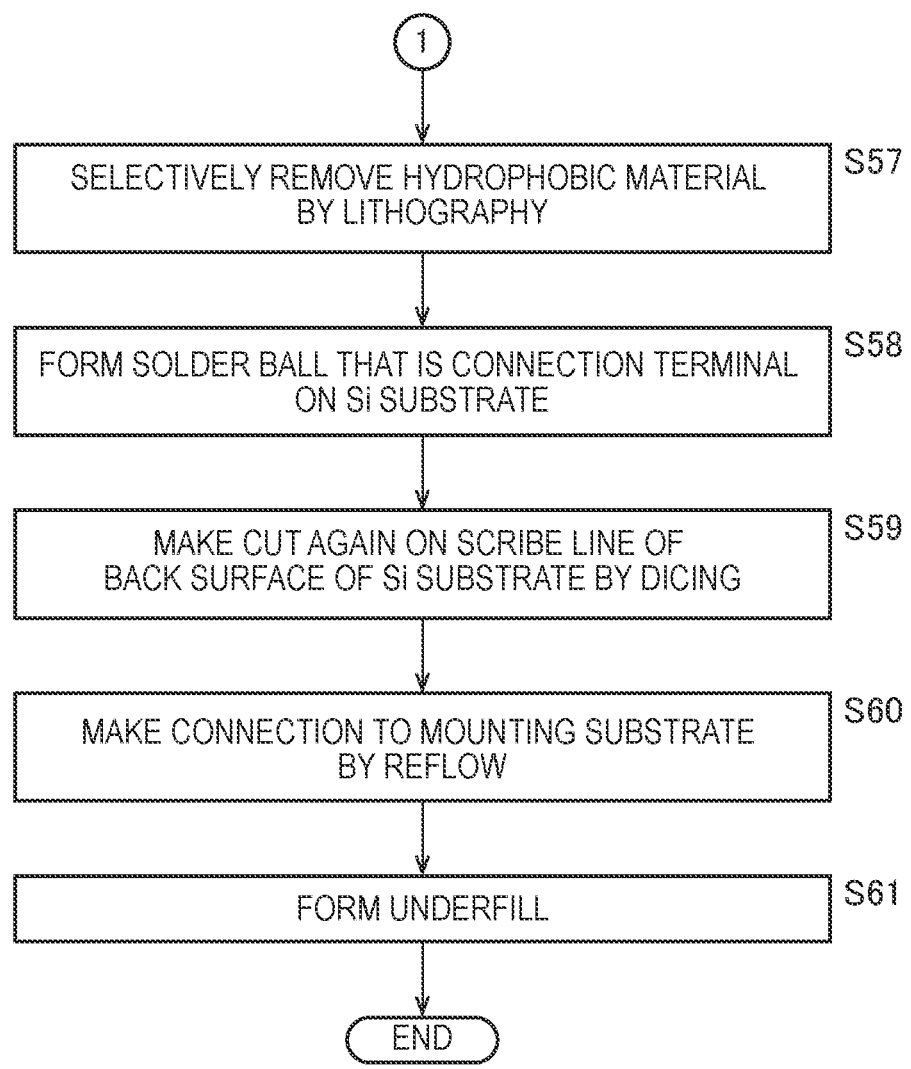
FIG. 11 is a flow chart describing the manufacturing processing of the CPS of FIG. 9.

Next, the manufacturing processing of the CPS 51 of FIG. 8 is described with reference to the flow charts of FIG. 10 and FIG. 11. In addition, this description refers to also the process diagram of FIG. 12. Further, steps S51 to S60 of FIG. 10 and FIG. 11 are basically similar to steps S11 to S20 of FIG. 3 and FIG. 4 except that the photosensitive material 31 is replaced with the hydrophobic material 61; hence, the description would be a repetition and is therefore omitted.

Figure 12:
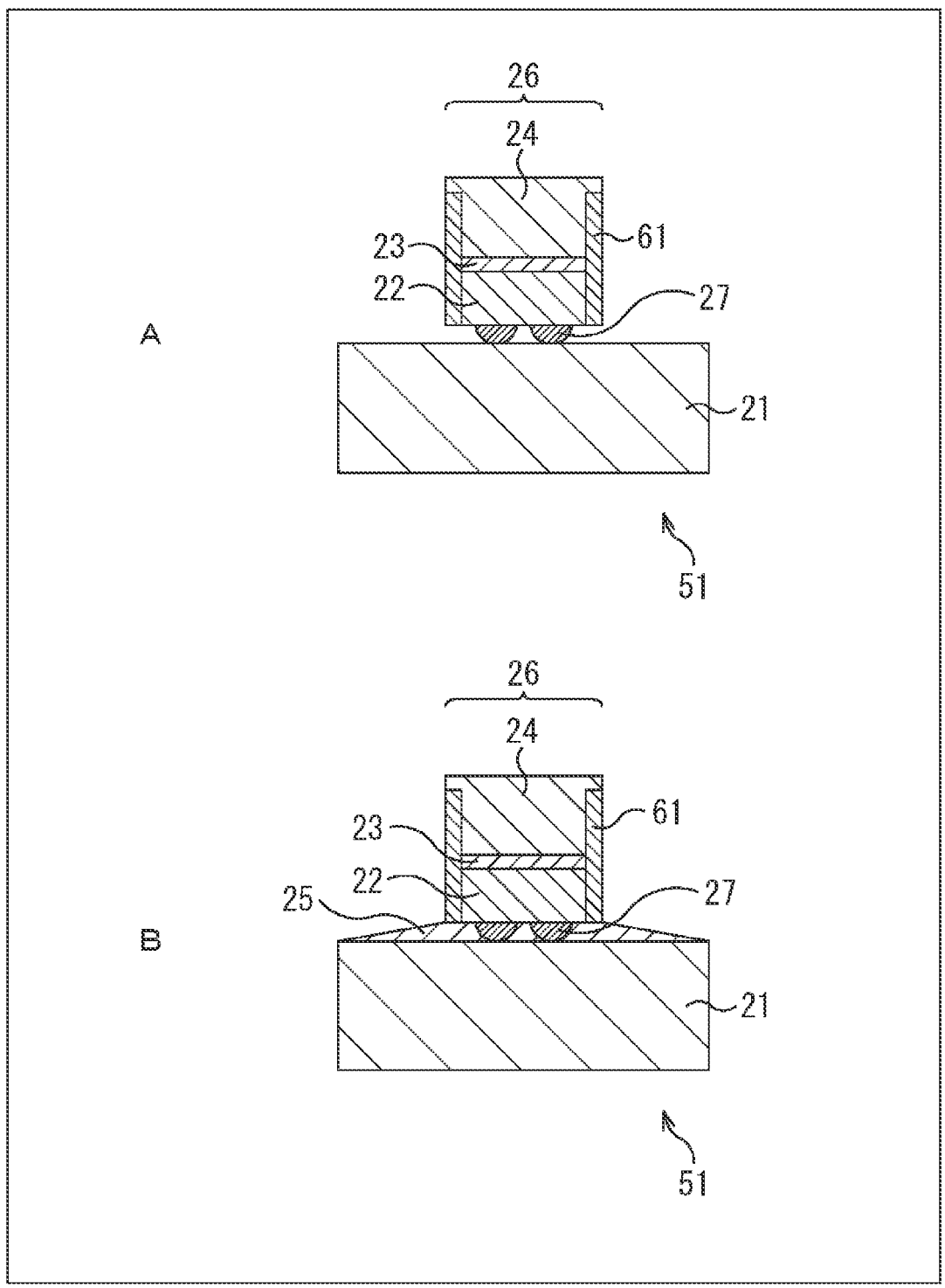
FIG. 12 is a diagram showing an example of the process of the manufacturing processing of the CPS of FIG. 9.

In step S60, as shown in A of FIG. 12, the manufacturing apparatus connects the chip 26 to the mounting substrate 21 by reflow.

In step S61, the manufacturing apparatus forms the underfill 25 (B of FIG. 12) in order to fix the chip 26 to the mounting substrate 21 stably.

In addition, in this example, the hydrophobic material 61 is used for the side wall of the chip 26. A fluoride material is used as the hydrophobic material 61, for example. Many fluoride materials are hydrophobic materials such as UF material epoxy, silicon, and phenolic resins; therefore, the underfill 25 does not rise to the side wall of the chip 26.

Thereby, a space where the underfill 25 does not creep up and cannot be formed is formed on a side wall portion of the chip 26, and the bottom surface of the chip 26 (the surface of the solder ball 27) is fixed stably. That is, little or no underfill 25 is adhered to the side wall of the CPS 15. Therefore, the original function of the underfill 25 is not impaired, and the peeling-off of the side wall of the chip can be suppressed.

Thus, in the present technology, an underfill resin having adhesiveness is not physically formed at the chip end in a CPS structure in which a plurality of kinds of materials appear at the chip end. Hence, the expansion and contraction of the underfill adhered to the mounting substrate does not influence the chip end.

In this event, since the underfill is adhered to a bottom portion of the chip, mounting reliability, which is the original function of the underfill, is maintained.

2. Second Embodiment

<CPS Structure of Present Technology>

Figure 13:
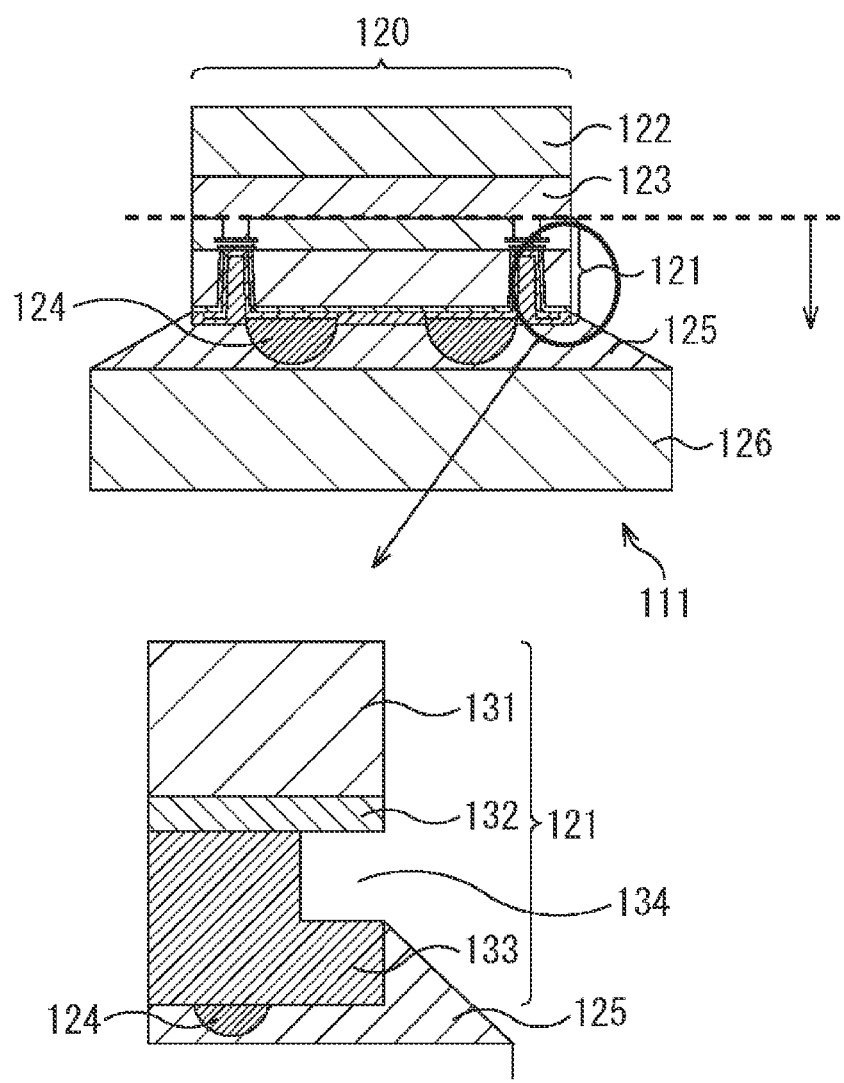
FIG. 13 is cross-sectional views showing another example of the structure of a CPS of an imaging element of the present technology.

FIG. 13 is cross-sectional views showing an example of the structure of a chip scale package (CPS) of an imaging element of the present technology.

In a CPS 111 of the example of FIG. 13, a chip 120 is mounted on a mounting substrate 126 by solder balls 124, and then an underfill 125 is put between the chip 120 and the mounting substrate 126.

The chip 120 is formed by a glass substrate 122 being produced on a bonding resin 123 formed on an imaging element 121.

As shown by the tip of the arrow, the imaging element 121 is configured with a Si substrate 131 in which a circuit of an imaging element is formed, an insulating film 132, and an insulating film 133 formed after reinterconnection formation in this order from the top, and a concavity 134 is formed on an end surface (a side wall) of the insulating film 133 in a direction parallel to the upper and lower surfaces of the chip 120.

By this structure, the height of the underfill 125 is not more than the height of the imaging element 121, that is, not higher than the dotted line shown in FIG. 13, and does not arrive at the side surface of the bonding resin 123. Hence, the underfill 125 does not adhere to the side surface of the bonding resin 123. Thereby, the creeping-up on the side surface of the underfill 125 can be suppressed, and mounting reliability can be improved.

<Manufacturing Processing of CPS of Present Technology>

Figure 14:
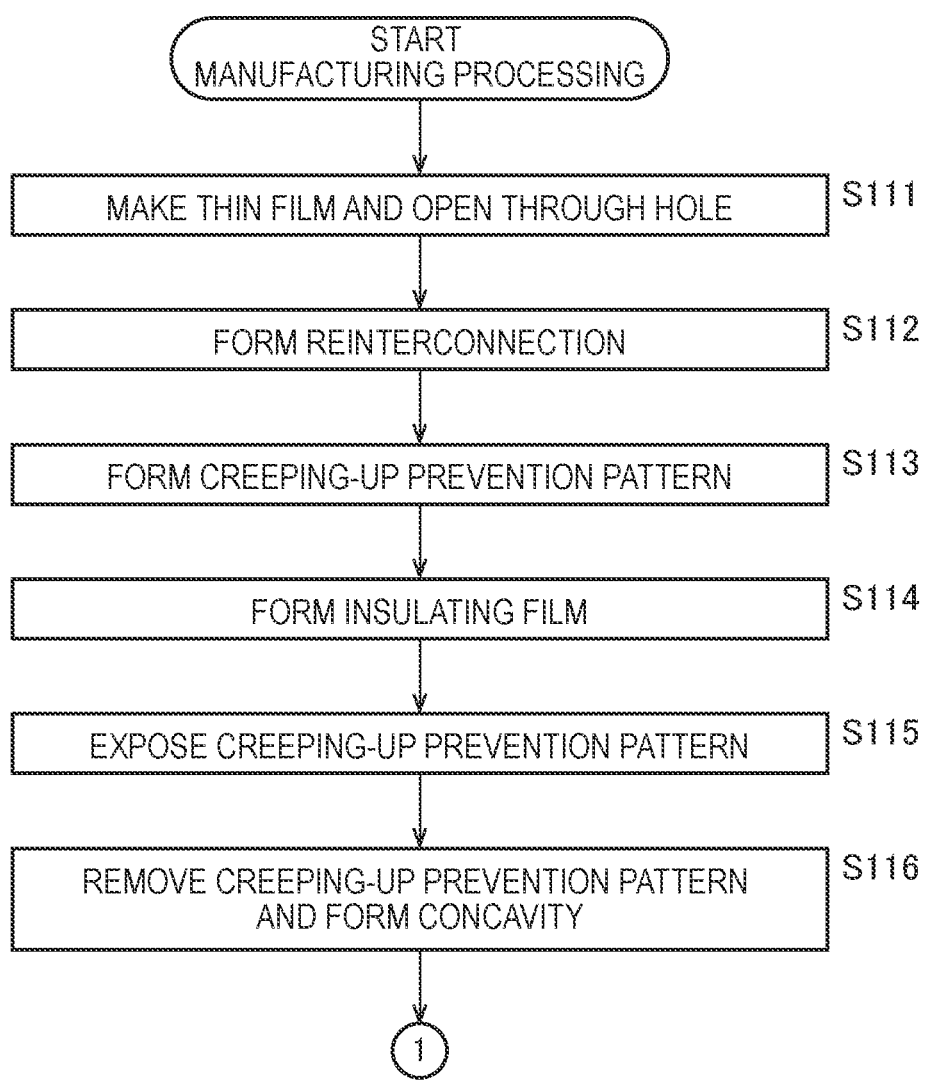
FIG. 14 is a flow chart describing the manufacturing processing of the CPS of FIG. 13.
Figure 15:
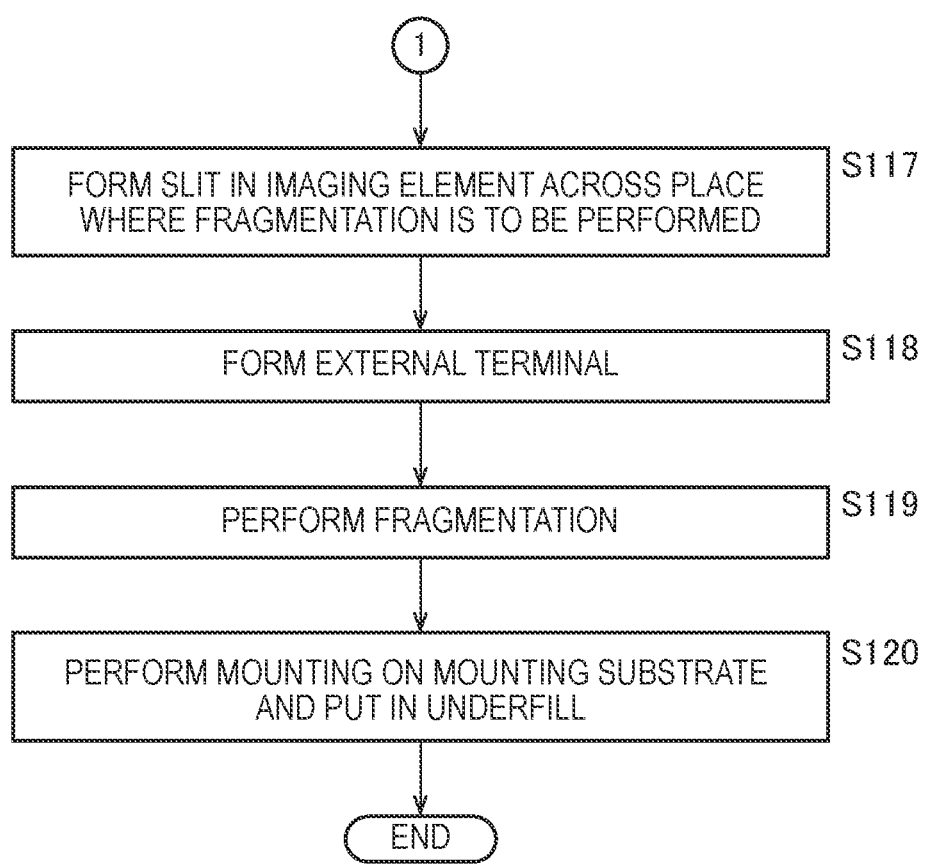
FIG. 15 is a flow chart describing the manufacturing processing of the CPS of FIG. 13.

Next, the manufacturing processing of the CPS 111 of FIG. 13 is described with reference to the flow charts of FIG. 14 and FIG. 15. In addition, this description refers to also the process diagrams of FIG. 16 to FIG. 20.

In step S111, the manufacturing apparatus exposes a surface of the Si substrate 131 on the opposite side to the light receiving surface (the upper side in the drawing) of the CPS 111 of the semiconductor element (chip) 120 that is obtained by bonding the imaging element 121 and the glass substrate 122 together by the bonding resin 123, thus makes a thin film, and opens through holes 144 to make a connection to connection pads of the element.

Figure 16:
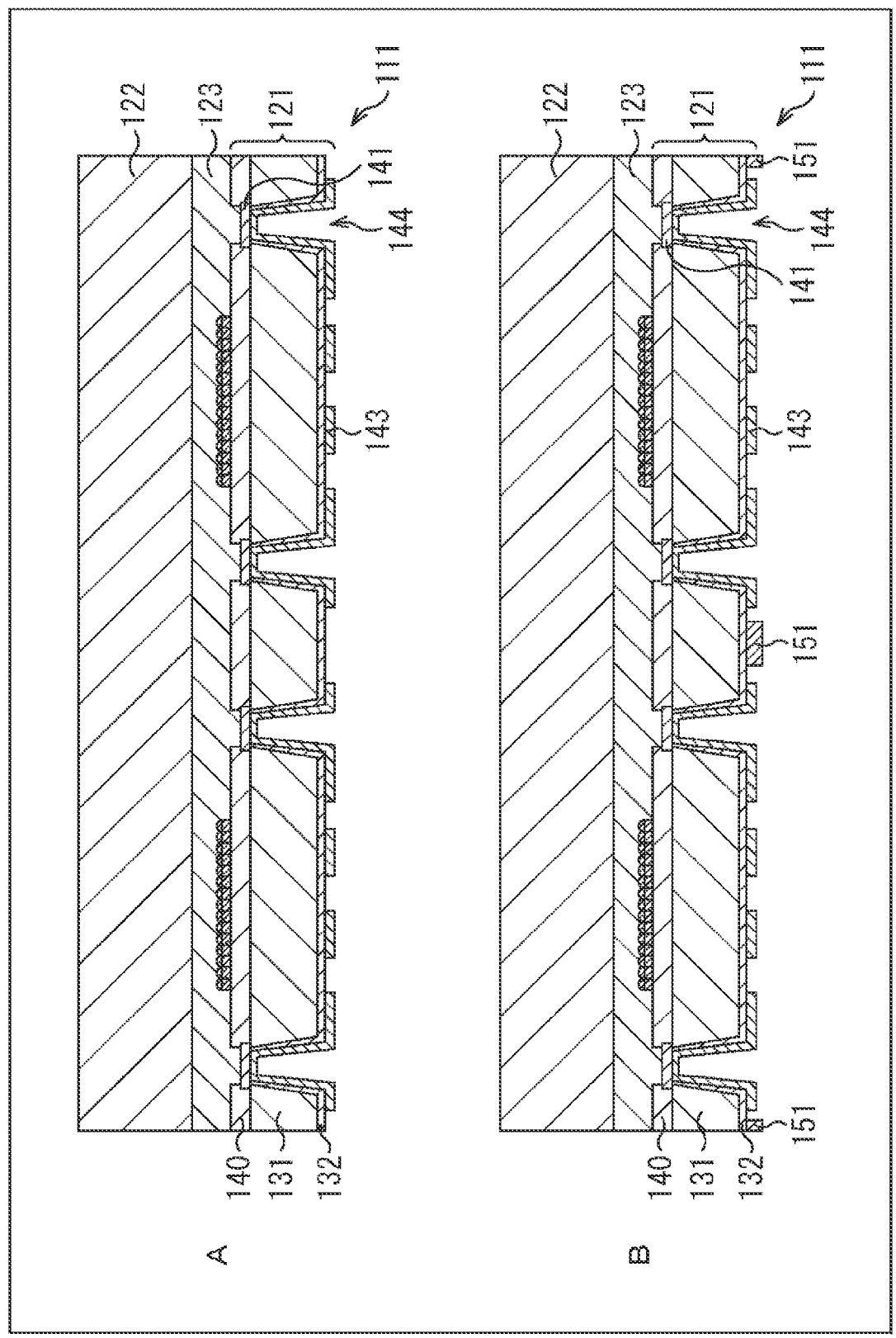
FIG. 16 is a diagram showing an example of the process of the manufacturing processing of the CPS of FIG. 13.

In step S112, the manufacturing apparatus deposits the insulating film 132 to provide insulation from the Si substrate 131, exposes connection pads 141 using a method such as etchback, and then forms reinterconnections 143 (A of FIG. 16).

In step S113, the manufacturing apparatus forms a creeping-up prevention pattern 151 (B of FIG. 16) in order to prevent the creeping-up of the underfill. The creeping-up prevention pattern 151 is formed of, for example, an insulating film of $SiO_2$, SiC, or the like, a metal film of Al, Ti, W, or the like, etc. Since the creeping-up prevention pattern 151 is removed by later processing, the material is not particularly limited to the above materials as long as it is a material that is easily processed in the removal process and the formation process. Here, the manufacturing apparatus arranges the creeping-up prevention pattern 151 across places where fragmentation is to be performed in a post-process.

Figure 17:
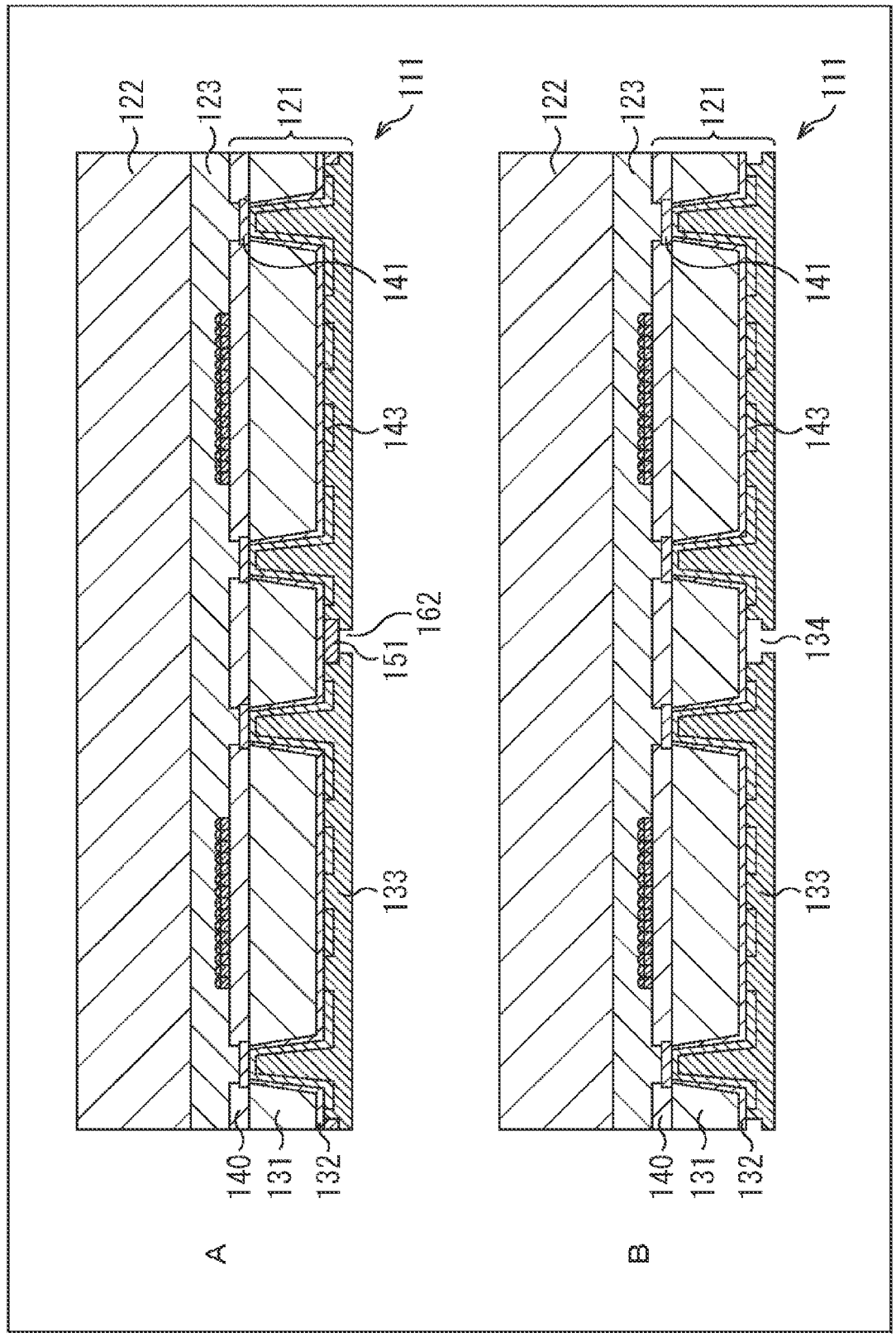
FIG. 17 is a diagram showing an example of the process of the manufacturing processing of the CPS of FIG. 13.
Figure 18:
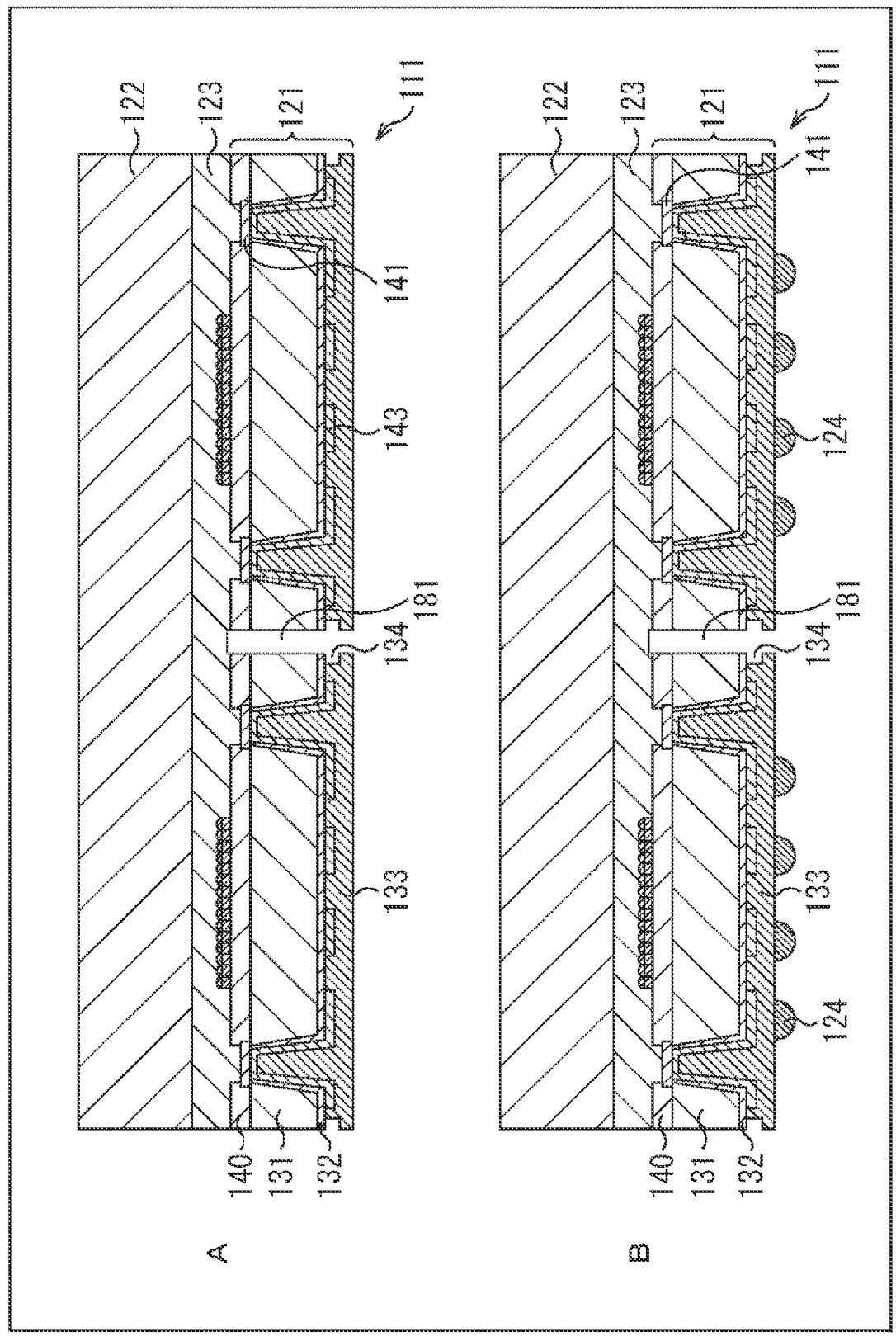
FIG. 18 is a diagram showing an example of the process of the manufacturing processing of the CPS of FIG. 13.
Figure 19:
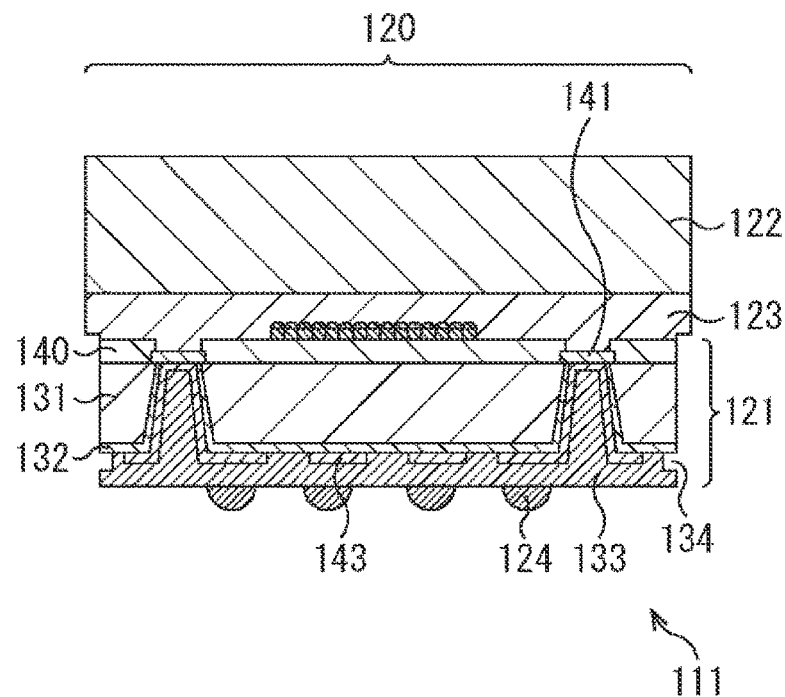
FIG. 19 is a diagram showing an example of the process of the manufacturing processing of the CPS of FIG. 13.
Figure 20:
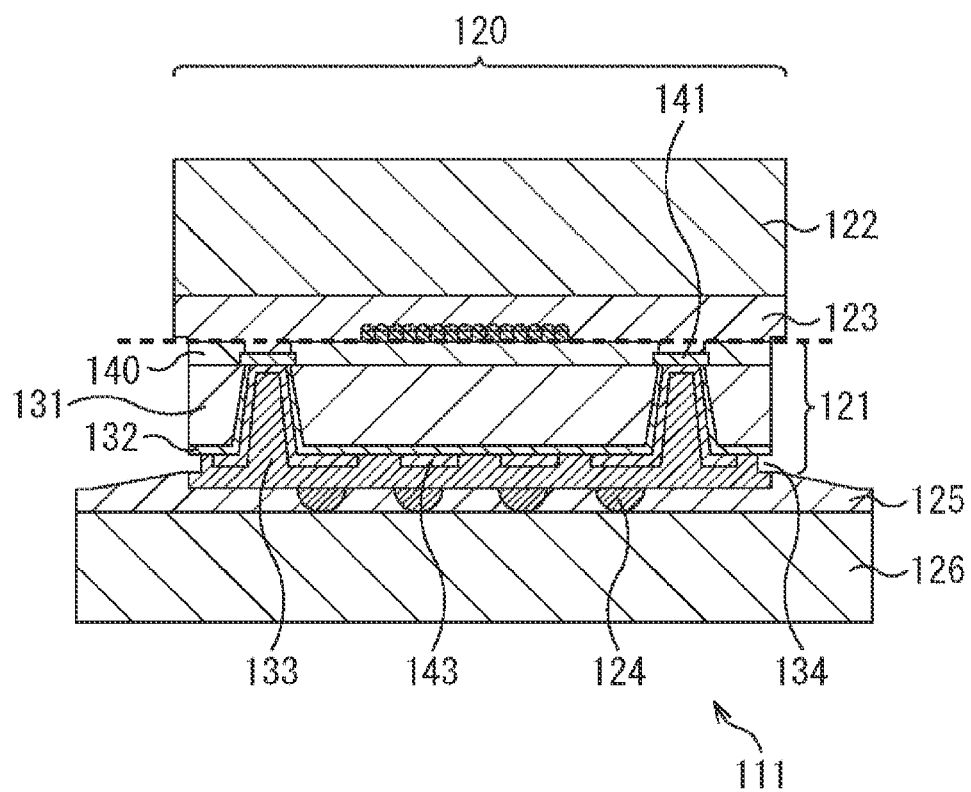
FIG. 20 is a diagram showing an example of the process of the manufacturing processing of the CPS of FIG. 13.

After that, in step S114, the manufacturing apparatus forms the insulating film 133 (A of FIG. 17). For example, the manufacturing apparatus performs patterning by lithography processing using a solder mask resist, and then performs heat treatment to form the insulating film 133.

In step S115, when performing the patterning by lithography, the manufacturing apparatus forms also slit openings 162 to expose the creeping-up prevention pattern 151.

In step S116, the manufacturing apparatus removes the creeping-up prevention pattern 151 using a method such as wet etching, and forms concavities 134 recessed from the side surface of the insulating film 132 (B of FIG. 17). The concavity 134 is recessed from the end surface of the insulating film 132.

In step S117, the manufacturing apparatus forms slits 181 (A of FIG. 18) in the imaging element 121 across the places where fragmentation is to be performed; and in step S118, the manufacturing apparatus forms solder balls 124 that are external terminals.

In step S119, the manufacturing apparatus performs fragmentation as chips 120 using a method such as dicing.

After that, in step S120, the manufacturing apparatus mounts the chip 120 on the mounting substrate 126, and puts in the underfill 125.

Since the concavity 134 is formed on an end surface (a side portion) of the imaging element 121 (the insulating film 132 of the imaging element 121) in the above manner, the creeping-up of the underfill 125 can be prevented. Thereby, the height of the underfill 125 is not more than the height of the imaging element 121, and the underfill is not formed on the side surface of the glass substrate 122.

In addition, although in the above description the creeping-up prevention pattern is produced after reinterconnection formation, the creeping-up prevention pattern may be produced before reinterconnection formation or at other times, and the order of the production process is not limited to that mentioned above.

<CPS Structure of Present Technology>

Figure 21:
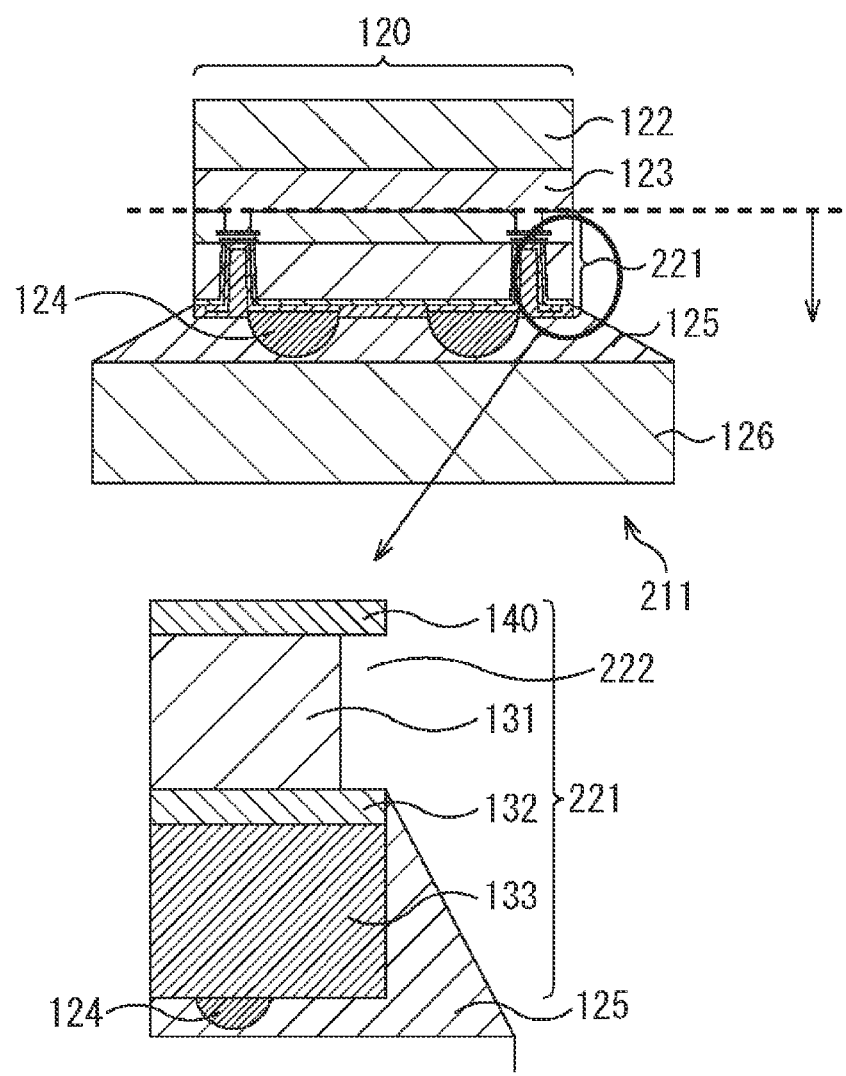
FIG. 21 is a cross-sectional view showing another example of the structure of the CPS of FIG. 13.

FIG. 21 is cross-sectional views showing another example of the structure of a chip scale package (CPS) of the imaging element of FIG. 13. In addition, in the example of FIG. 21, portions corresponding to the example of FIG. 13 are marked with the corresponding reference signs.

In a CPS 111 of the example of FIG. 21, the chip 120 is mounted on the mounting substrate 126 by solder balls 124, and then the underfill 125 is put between the chip 120 and the mounting substrate 126.

The chip 120 is formed by the glass substrate 122 being produced on the bonding resin 123 formed on an imaging element 221.

As shown by the tip of the arrow, the imaging element 221 is configured with an insulating film 140, the Si substrate 131 in which a circuit of an imaging element is formed, the insulating film 132, and the insulating film 133 formed after reinterconnection formation in this order from the top, and a concavity 222 is formed on an end surface (a side wall) of the Si substrate 131 in a direction parallel to the upper and lower surfaces of the chip 120.

By this structure, the height of the underfill 125 is not more than the height of the imaging element 221, that is, not higher than the dotted line shown in FIG. 21, and does not arrive at the side surface of the bonding resin 123. Thereby, the creeping-up on the side surface of the underfill 125 can be suppressed, and mounting reliability can be improved.

<Manufacturing Processing of CPS of Present Technology>

Figure 22:
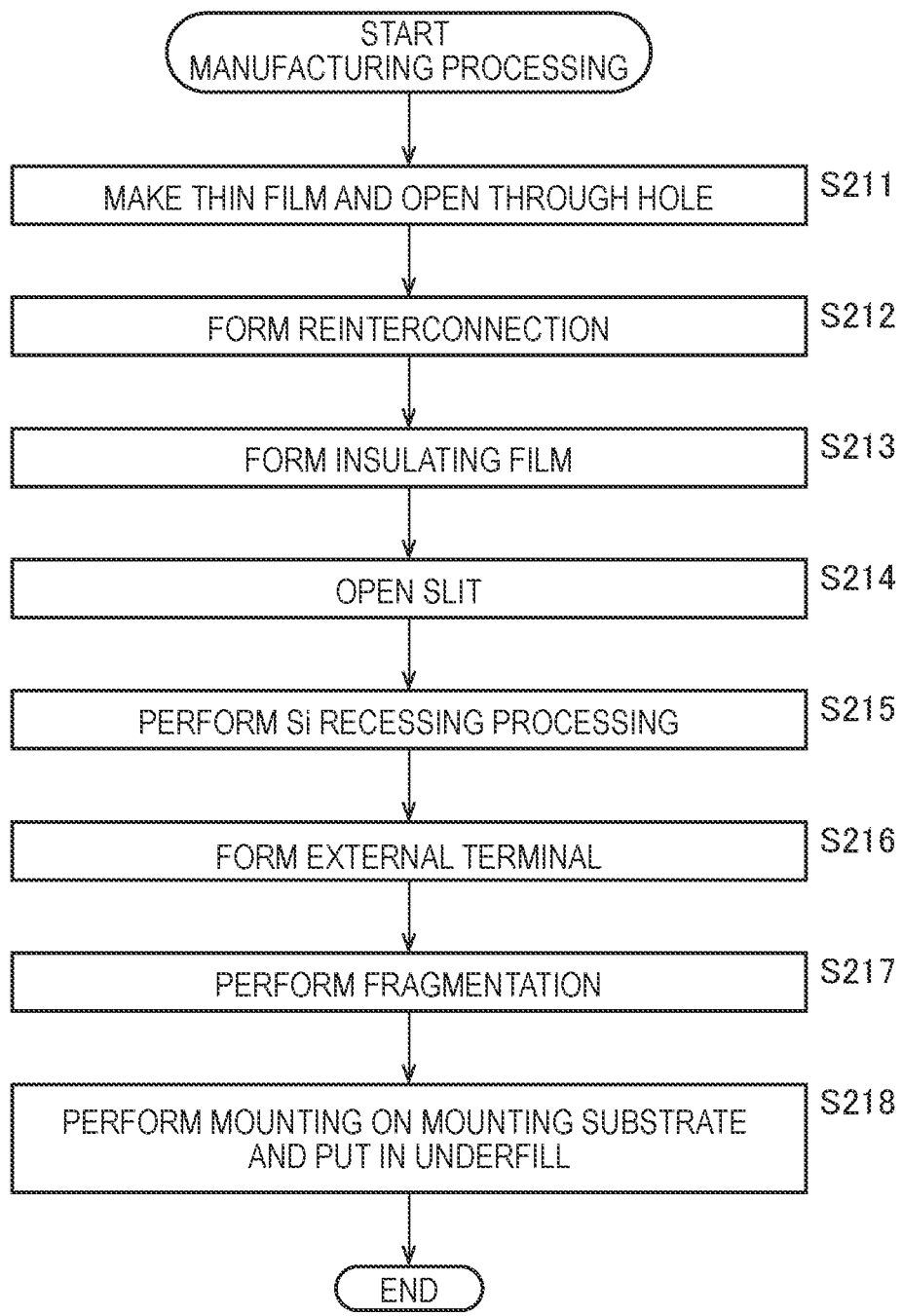
FIG. 22 is a flow chart describing the manufacturing processing of the CPS of FIG. 21.

Next, the manufacturing processing of the CPS 211 of FIG. 21 is described with reference to the flow chart of FIG. 22. In addition, this description refers to also the process diagrams of FIG. 23 to FIG. 26.

In step S211, the manufacturing apparatus exposes a surface of the Si substrate 131 on the opposite side to the light receiving surface (the upper side in the drawing) of the CPS 211 of the semiconductor element (chip) 120 that is obtained by bonding the imaging element 221 and the glass substrate 122 together by the bonding resin 123, thus makes a thin film, and opens through holes 144 to make a connection to connection pads of the element.

In step S212, the manufacturing apparatus deposits the insulating film 132 to provide insulation from the Si substrate 131, exposes connect pads 141 using a method such as etchback, and then forms reinterconnections 143.

Figure 23:
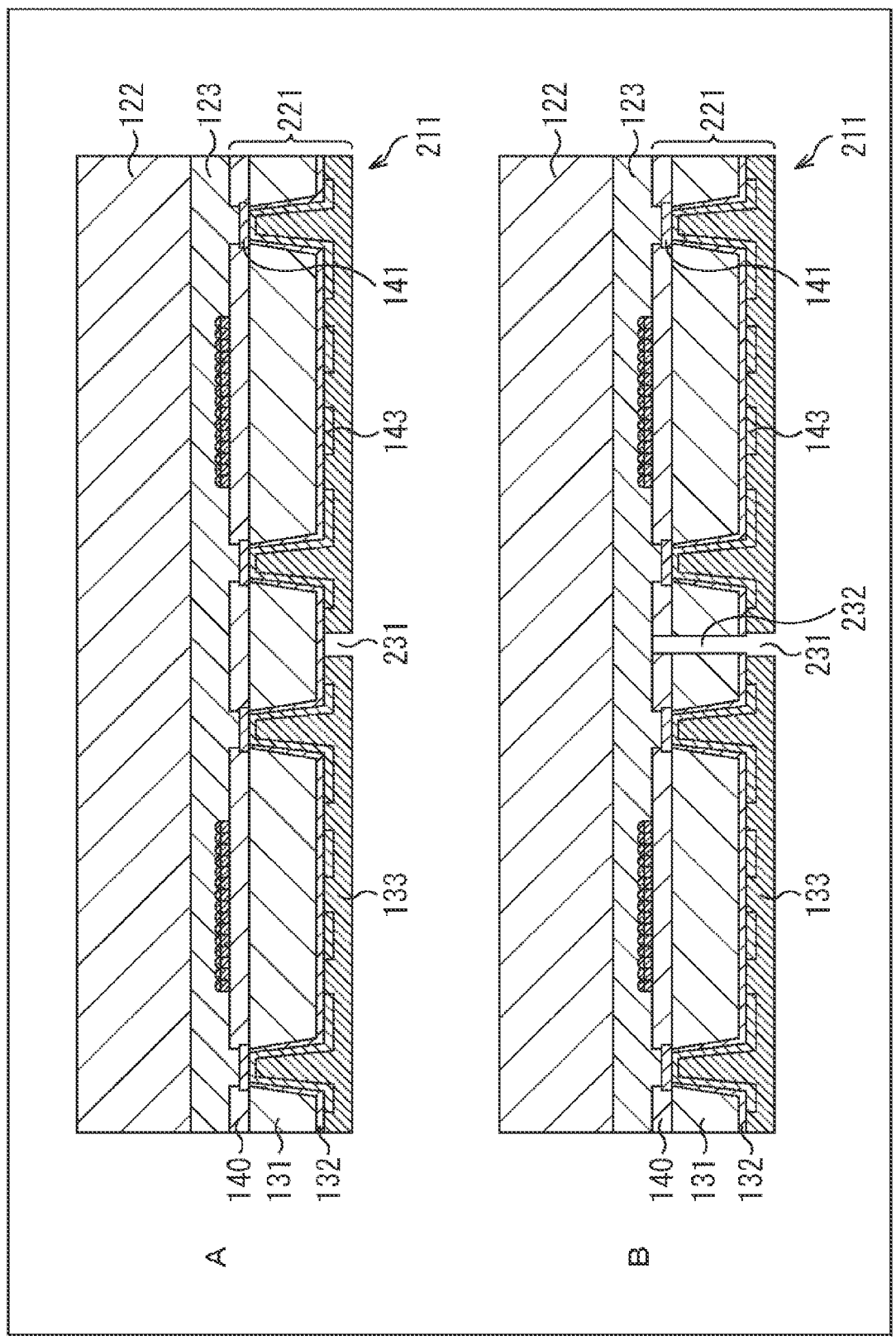
FIG. 23 is a diagram showing an example of the process of the manufacturing processing of the CPS of FIG. 21.
Figure 24:
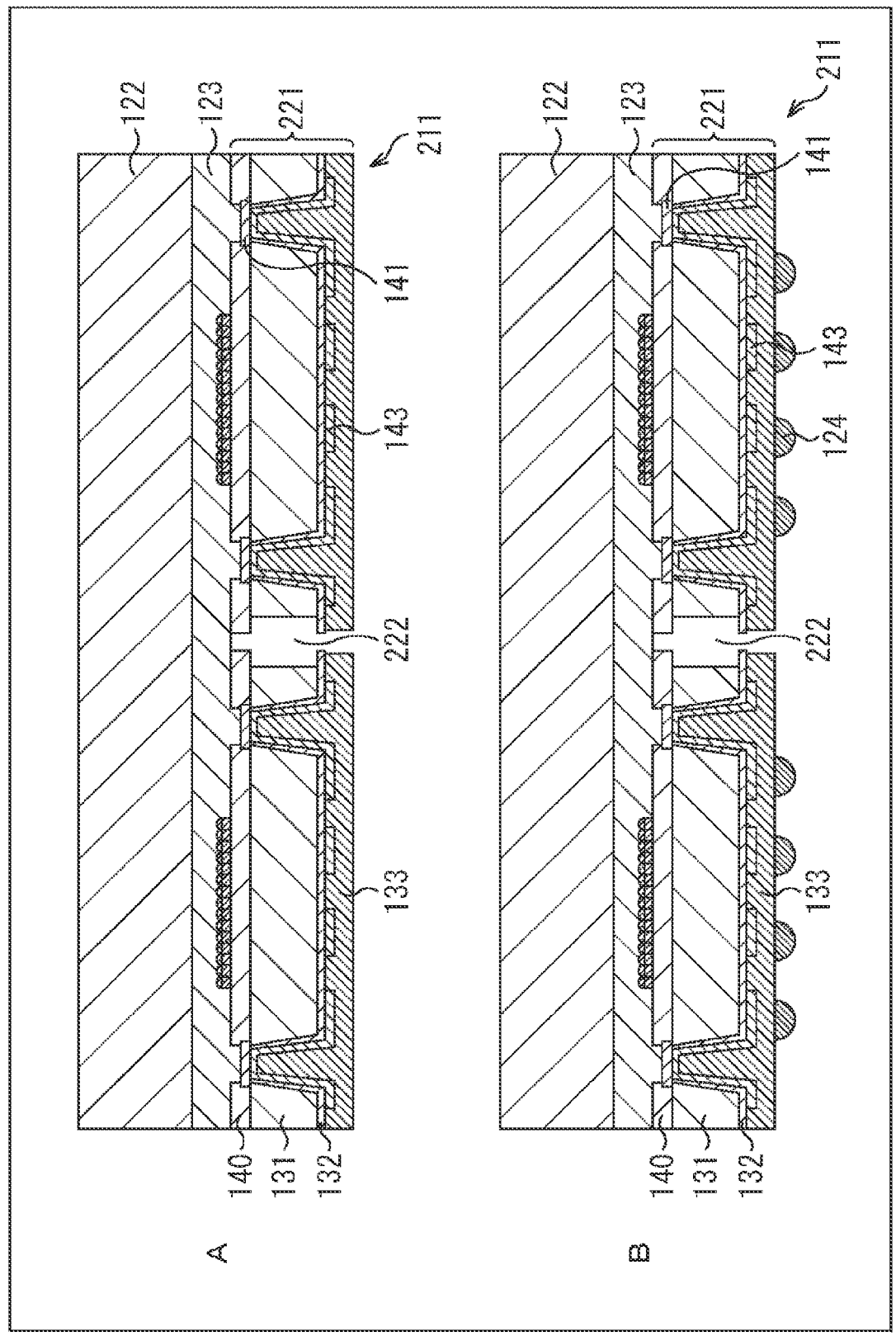
FIG. 24 is a diagram showing an example of the process of the manufacturing processing of the CPS of FIG. 21.

In step S213, the manufacturing apparatus forms the insulating film 133 (A of FIG. 23). For example, the manufacturing apparatus performs patterning by lithography processing using a solder mask resist, then performs heat treatment to form the insulating film 133. Further, when performing the patterning by lithography, slit openings 231 that are places where a slit is to be formed are opened beforehand.

In step S214, the manufacturing apparatus opens slits 232 (B of FIG. 23) using lithography, dry processing technology, etc.

In step S215, in order to form a concave-convex structure on the end surface of the imaging element 221, the manufacturing apparatus performs Si recessing processing using technology such as dry etching processing in an isotropic manner or wet etching processing. Thereby, as shown in A of FIG. 24, concavities 222 are formed on the Si substrate 131, and the end surface of the Si substrate 131 is recessed from the insulating film 140 and the insulating film 133. In addition, the place of the Si recessing processing stretches across a place where fragmentation is to be performed in a post-process.

In step S216, the manufacturing apparatus forms solder balls 124 (B of FIG. 24) that are external terminals.

Figure 25:
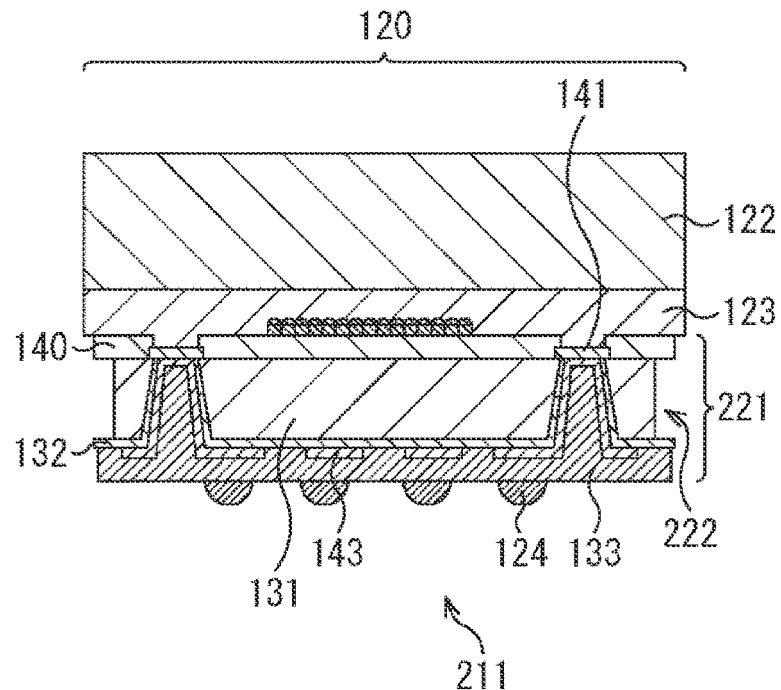
FIG. 25 is a diagram showing an example of the process of the manufacturing processing of the CPS of FIG. 21.

In step S217, as shown in FIG. 25, the manufacturing apparatus performs fragmentation as chips 120 using a method such as dicing.

Figure 26:
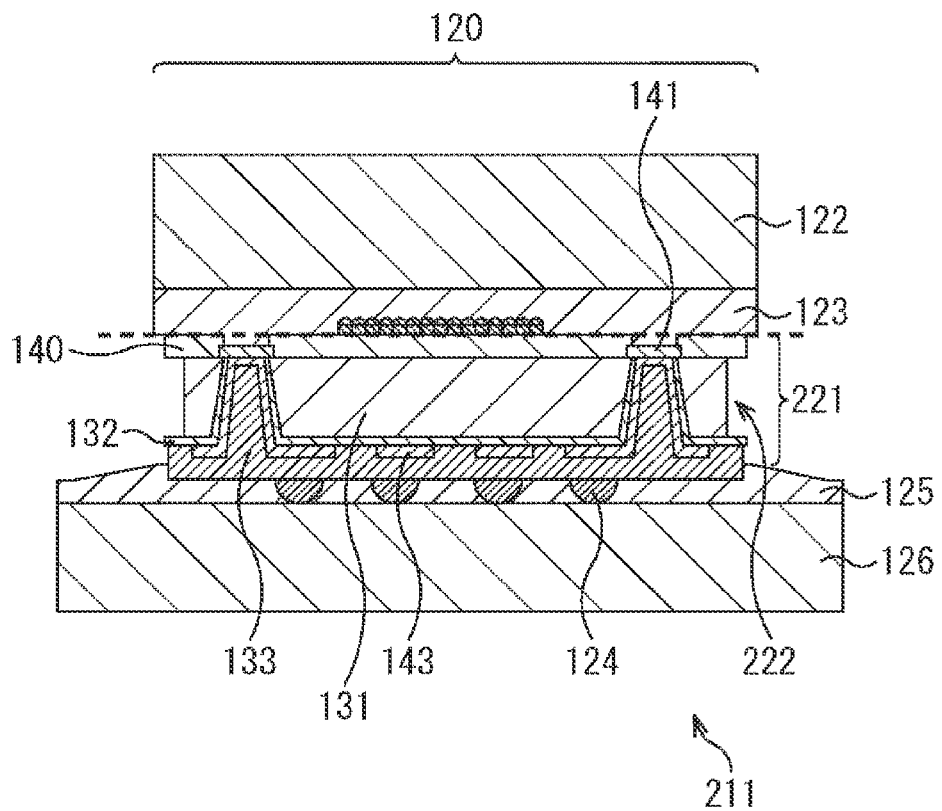
FIG. 26 is a diagram showing an example of the process of the manufacturing processing of the CPS of FIG. 21.

After that, in step S218, as shown in FIG. 26, the manufacturing apparatus mounts the chip 120 on the mounting substrate 126, and puts in the underfill 125.

Since the concavity 222 is formed on an end surface (a side portion) of the imaging element 221 in the above manner, the creeping-up of the underfill 125 can be prevented. Thereby, the height of the underfill 125 is not more than the height of the imaging element 221, and the underfill is not formed on the side surface of the glass substrate 122.

In addition, although an example in which the concavity 134 is formed on the insulating film 132 in the imaging element 121 and an example in which the concavity 222 is formed on the Si substrate 131 in the imaging element 221 are described, these two examples may be combined to form a plurality of concavities (the concavities 134 and 222). In a case of a plurality of concavities, even if the outflow of the underfill cannot be sufficiently prevented by a first concavity and creeping-up occurs, the creeping-up can be suppressed by a second concavity; thus, this has more effect.

Further, although an example in which the concavity 222 is formed on the Si substrate is described in the example described above, the concavity may be formed on the insulating film 140 with respect to the insulating film 133 and the Si substrate 131. A structure in which concavity/convexity is provided on the end surface of the imaging element 121 (221) in a direction parallel to the upper and lower surfaces of the chip 120 is sufficient, and the structure is not particularly limited.

In the above description, examples of an imaging element of a non-stacked structure are described. However, these days, a structure in which, for example, an imaging element and a logic circuit are stacked is proposed in order to improve the performance of the semiconductor element. Next, an example using a stack-type imaging element is described.

<Manufacturing Processing of CPS of Present Technology>

Figure 27:
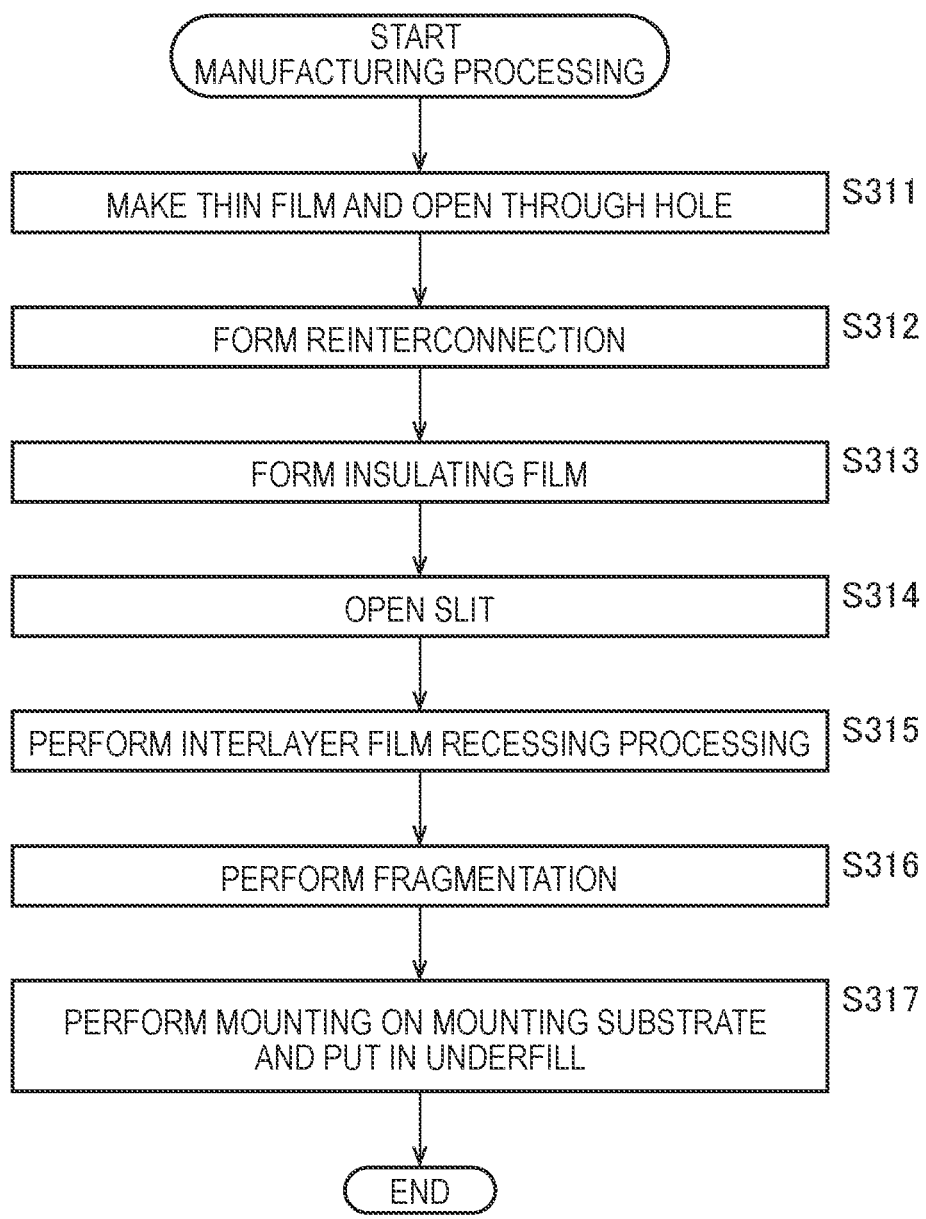
FIG. 27 is a flow chart describing the manufacturing processing of a CPS of a stack-type imaging element.

Next, the manufacturing processing of a CPS of a stack-type imaging element is described with reference to the flow chart of FIG. 27. In addition, this description refers to also the process diagrams of FIG. 28 and FIG. 29.

Figure 28:
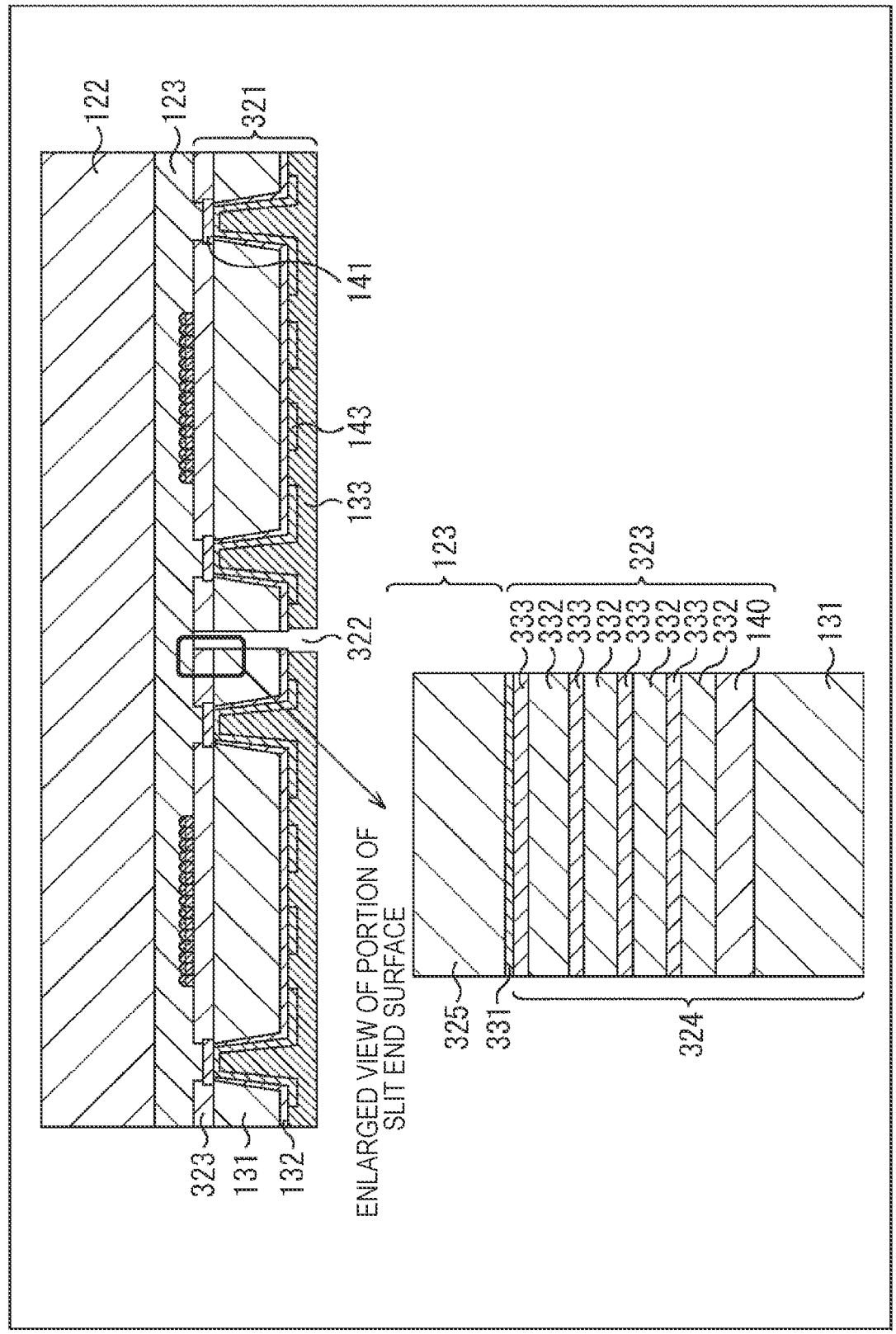
FIG. 28 is a diagram showing an example of the process of the manufacturing processing of a CPS of a stack-type imaging element.

In step S311, as shown in FIG. 28, the manufacturing apparatus exposes a surface of the Si substrate 131 on the opposite side to the light receiving surface (the upper side in the drawing) of a CPS 311 of a semiconductor element (chip) in which a semiconductor element 321 in which an imaging element 325 and a logic circuit 324 are stacked and the glass substrate 122 are bonded together by the bonding resin 123, thus makes a thin film, and opens through holes 144 to make a connection to connection pads of the element.

In step S312, the manufacturing apparatus deposits the insulating film 132 to provide insulation from the Si substrate 131, exposes connection pads 141 using a method such as etchback, and then forms reinterconnections 143.

In step S313, the manufacturing apparatus forms the insulating film 133. For example, the manufacturing apparatus performs patterning by lithography processing using a solder mask resist, and then performs heat treatment to form the insulating film 133. Further, when performing the patterning by lithography, places where a slit is to be formed are opened beforehand.

In step S314, the manufacturing apparatus opens slits 322 (FIG. 28) using lithography, dry processing technology, etc.

FIG. 28 is cross-sectional views showing an example of the structure of a CPS of a stack-type imaging element. In addition, in the example of FIG. 27, portions corresponding to the example of FIG. 13 or FIG. 21 are marked with the corresponding reference signs. Further, in the example of FIG. 27, a structure before concavities are formed is shown.

In the CPS 311, the semiconductor element 321 in which the imaging element 325 and the logic circuit 324 are stacked is configured with an interconnection layer 323 to which the imaging element 325 is bonded by a bonding unit 331, the insulating film 140, the Si substrate 131, the insulating film 132, and the insulating film 133 formed after reinterconnection formation in this order from the top.

In FIG. 28, the logic circuit 324 is configured so as to include the interconnection layer 323, the insulating film 140, and the Si substrate 131. The interconnection layer 323 is configured such that generally a Cu interconnection is used as a lower layer, an insulating film of SiO, SiOC, or the like is used as an interlayer film 332 of the Cu damascene interconnection, and SiC, SiN, SiCN, or the like is used as a cap film 333 of the Cu interconnection. Although the example of FIG. 27 shows an interlayer film configuration of a case where the number of interconnection layers is four including a Cu interconnection and an Al interconnection, the number of interconnection layers is not limited.

In step S315, in order to form a concave-convex structure on the end surface of the interconnection layer 323 of the logic circuit 324, the manufacturing apparatus performs interlayer film recessing processing using technology such as dry etching processing in an isotropic manner or wet etching processing. Since there is an etching rate difference between the interlayer film and the cap film, a concave-convex structure is formed on the interconnection layer 323 of the logic circuit 324 by the interlayer film recessing processing.

Figure 29:
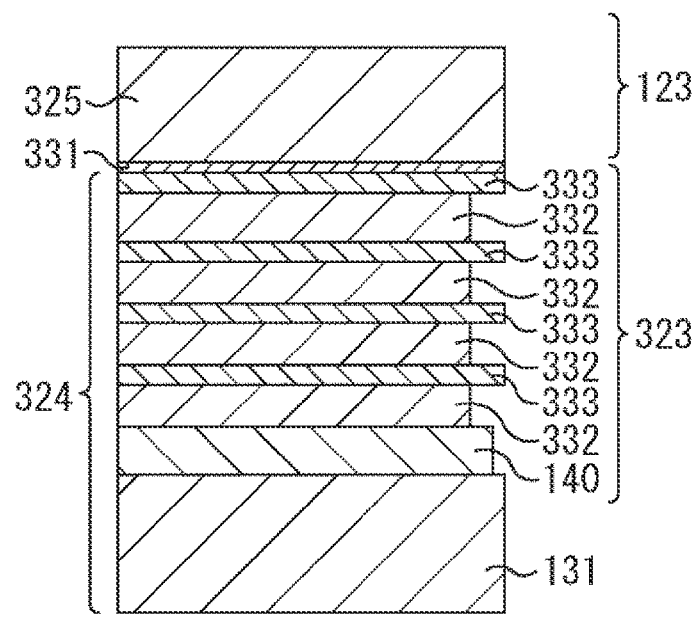
FIG. 29 is a diagram showing an example of the process of the manufacturing processing of a CPS of a stack-type imaging element.

That is, as shown in FIG. 29, the insulating film 140 and the interlayer film 332 in the interconnection layer 323 are recessed, and the recessed place forms a concavity. In addition, the place of the interlayer curtain recessing processing stretches across a place where fragmentation is to be performed in a post-process.

Further, the film formation conditions, material, etc. of the interlayer insulating film vary with the interconnection layer, and therefore it does not matter if the amount of recessing is different between interlayer films. Then, also a case where concavity/convexity is formed also on the imaging element is included.

Returning to FIG. 27, in step S316, the manufacturing apparatus forms solder balls that are external terminals.

In step S317, the manufacturing apparatus performs fragmentation as chips using a method such as dicing. In step S318, the manufacturing apparatus mounts the chip on a mounting substrate, and puts in an underfill.

Since a concavity/convexity structure is formed on an end surface (a side portion) of the logic circuit in the above manner, the creeping-up of the underfill can be prevented. Thereby, the height of the underfill is not more than the height of the imaging element, and the underfill is not formed on the side surface of the glass substrate.

All the examples of the present technology described above may be combined.

Thus, according to the present technology, the creeping-up of an underfill is suppressed and the underfill agent is in contact only with an imaging element; therefore, the influence of warpage due to a difference in thermal expansion coefficient between glass and Si can be reduced, and mounting reliability can be improved.

In addition, although hereinabove configurations in which the present technology is applied to a CMOS solid-state imaging sensor are described, the present technology may be applied also to a solid-state imaging sensor such as a charge-coupled device (CCD) solid-state imaging sensor. Further, the present technology may be applied to, as well as solid-state imaging sensors, semiconductor devices.

3. Third Embodiment (Usage Examples of Image Sensor)

Figure 30:
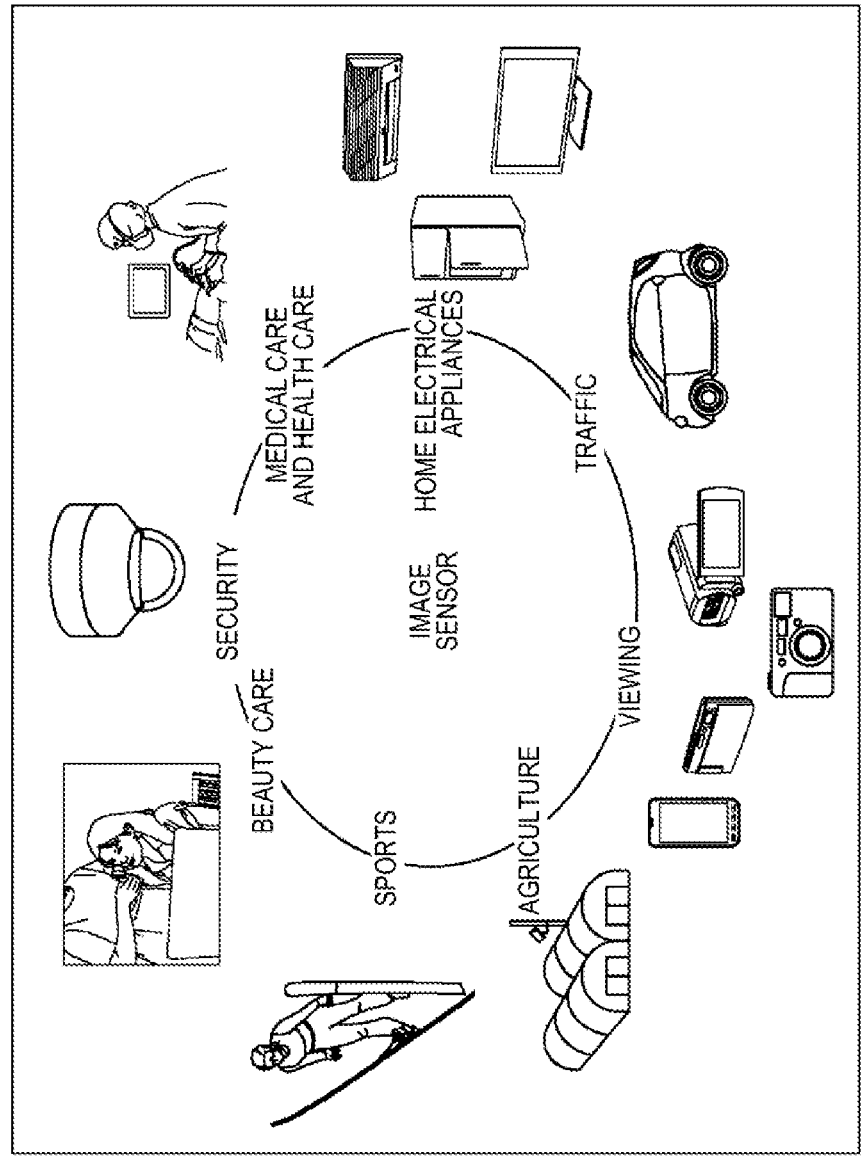
FIG. 30 is a diagram showing the structure of a solid-state imaging sensor to which the present technology is applied.

FIG. 30 illustrates the usage examples of the above-described solid-state imaging sensor.

The above-described solid-state imaging sensor (image sensor) can be used for, for example, various cases in which light such as visible light, infrared light, ultraviolet light, or X-rays is detected as follows.

Devices that take images used for viewing, such as a digital camera and a portable appliance with a camera function.

Devices used for traffic, such as an in-vehicle sensor that takes images of the front and the back of a car, surroundings, the inside of the car, and the like, a monitoring camera that monitors travelling vehicles and roads, and a distance sensor that measures distances between vehicles and the like, which are used for safe driving (e.g., automatic stop), recognition of the condition of a driver, and the like.

Devices used for home electrical appliances, such as a TV, a refrigerator, and an air conditioner, to takes images of a gesture of a user and perform appliance operation in accordance with the gesture.

Devices used for medical care and health care, such as an endoscope and a device that performs angiography by reception of infrared light.

Devices used for security, such as a monitoring camera for crime prevention and a camera for personal authentication.

Devices used for beauty care, such as skin measurement equipment that takes images of the skin and a microscope that takes images of the scalp.

Devices used for sports, such as an action camera and a wearable camera for sports and the like.

Devices used for agriculture, such as a camera for monitoring the condition of the field and crops.

4. Fourth Embodiment (Example of Electronic Device)

The present technology is not limited to application to solid-state imaging devices, and is also applicable to imaging devices. Here, imaging devices refer to a camera system (e.g., a digital still camera and a digital video camera) and an electronic device with an imaging function (e.g., a mobile phone). Note that a module form mounted on an electronic device, that is, a camera module, is taken as an imaging device in some cases.

Hence, a configuration example of an electronic device according to the present technology will be described, with reference to FIG. 31.

Figure 31:
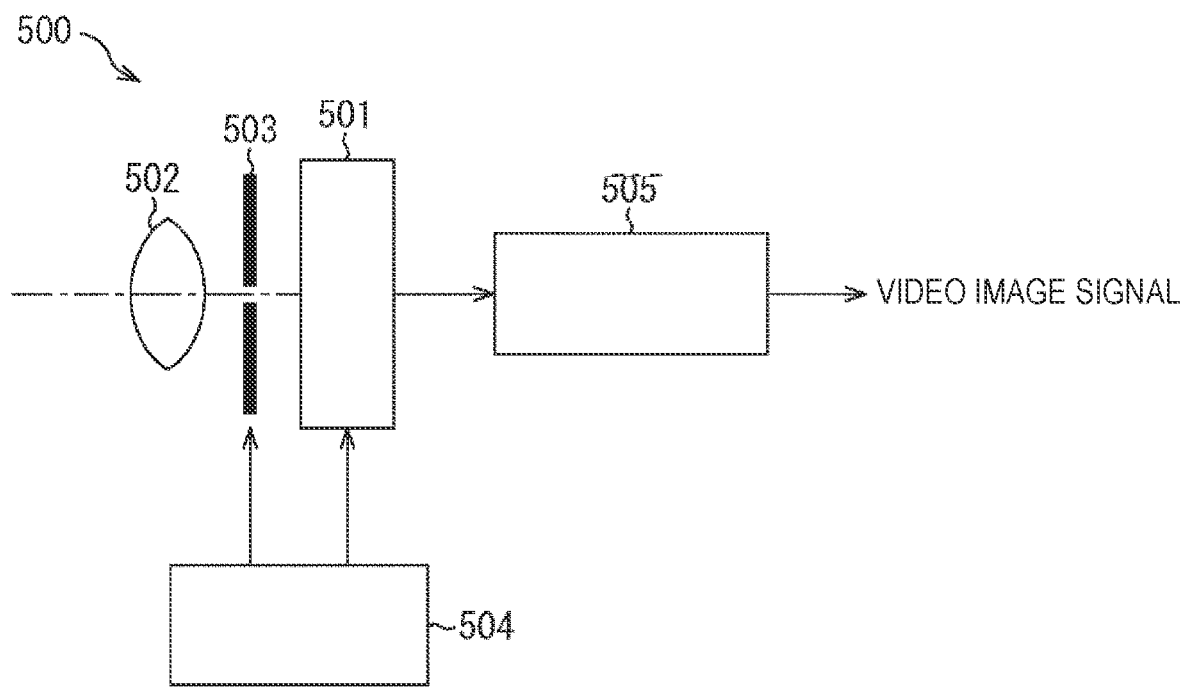
FIG. 31 is a block diagram showing an example of the configuration of an electronic device to which the present technology is applied.

An electronic device 500 shown in FIG. 31 includes a solid-state imaging sensor (element chip) 501, an optical lens 502, a shutter device 503, a driving circuit 504, and a signal processing circuit 505. As the solid-state imaging sensor 501, a chip of the first embodiment and the second embodiment of the present technology described above (a semiconductor element in which an imaging element is formed) is provided. Thereby, the reliability of the solid-state imaging sensor 501 of the electronic device 500 can be improved.

The optical lens 502 causes image light (incident light) derived from a subject to be formed as an image on the imaging surface of the solid-state imaging sensor 501. Thereby, a signal charge is stored in the solid-state imaging sensor 501 for a certain period of time. The shutter device 503 controls the light irradiation period and the light blocking period for the solid-state imaging sensor 501.

The driving circuit 504 supplies a driving signal that controls the signal transfer operation of the solid-state imaging sensor 501 and the shutter operation of the shutter device 503. The solid-state imaging sensor 501 performs signal transfer on the basis of the driving signal (timing signal) supplied from the driving circuit 504. The signal processing circuit 505 performs various pieces of signal processing on the signal outputted from the solid-state imaging sensor 501. A video image signal that has undergone signal processing is stored in a storage medium such as a memory or is outputted to a monitor.

Note that, in this specification, steps in which a series of processes above described is written do not necessarily have to be performed in time series in line with the order of the steps, and instead may include processing that is performed in parallel or individually.

In addition, embodiments of the present disclosure are not limited to the above-described embodiments, and various alterations may occur insofar as they are within the scope of the present disclosure.

Further, an element described as a single device (or a processing unit) above may be divided and configured as a plurality of devices (or processing units). On the contrary, elements described as a plurality of devices (or processing units) above may be configured collectively as a single device (or a processing unit). Further, an element other than those described above may be added to each device (or a processing unit). Furthermore, a part of an element of a given device (or a processing unit) may be included in an element of another device (or another processing unit) as long as the configuration or operation of the system as a whole is substantially the same. In other words, an embodiment of the disclosure is not limited to the embodiments described above, and various changes and modifications may be made without departing from the scope of the disclosure.

The preferred embodiment(s) of the present disclosure has/have been described above with reference to the accompanying drawings, whilst the present disclosure is not limited to the above examples. A person skilled in the art may find various alterations and modifications within the scope of the appended claims, and it should be understood that they will naturally come under the technical scope of the present disclosure.

Additionally, the present technology may also be configured as below.

(1)
A semiconductor device including:
a chip size package (CSP) composed of
a first substrate in which a circuit is formed,
a second substrate made of a material different from the first substrate, and
a bonding unit configured to bond the second substrate onto the first substrate; and
a mounting substrate configured to mount the CSP,
in which the CSP is formed in a structure in which an underfill used at a time of being mounted on the mounting substrate is prevented from adhering to a side wall of the second substrate.

(2)
The semiconductor device according to (1),
in which the CSP is formed in a structure in which the underfill is prevented from adhering to a part or substantially a whole of a side wall of the CSP.

(3)
The semiconductor device according to (1) or (2),
in which the CSP is formed in a structure in which a photosensitive material formed on a part or substantially a whole of a side wall of the CSP is removed and thereby the underfill is prevented from adhering to the part or substantially the whole of the side wall of the CSP.

(4)
The semiconductor device according to (1) or (2),
in which the CSP is formed in a structure in which a hydrophobic material is formed on a part or substantially a whole of a side wall of the CSP and thereby the underfill is prevented from adhering to the part or substantially the whole of the side wall of the CSP.

(5)
The semiconductor device according to (1),
in which one or a plurality of concavities/convexities are formed on a part of a side wall of the first substrate and thereby the CSP is formed in a structure in which the underfill is prevented from adhering to the side wall of the second substrate.

(6)
The semiconductor device according to (5),
in which a through hole for exposing a bottom surface of the first substrate and making a connection to a connection pad of the circuit is opened,
an insulating film of the first substrate is deposited,
then the connection pad is exposed,
a reinterconnection is formed,
then a creeping-up prevention pattern is formed,
an insulating film unit is formed,
then the creeping-up prevention pattern is removed,
a concavity is formed on the insulating film unit, and
thereby one or a plurality of concavities/convexities are formed on a part or substantially a whole of a side wall of the first substrate.

(7)
The semiconductor device according to (6),
in which the creeping-up prevention pattern is arranged to stretch across a place where fragmentation is to be performed.

(8)
The semiconductor device according to (5),
in which a through hole for exposing a bottom surface of the first substrate and making a connection to a connection pad of the circuit is opened,
an insulating film of the first substrate is deposited,
then the connection pad is exposed,
a reinterconnection is formed,
then an insulating film unit is formed,
the first substrate is opened,
then processing of recessing the first substrate is performed, and
thereby one or a plurality of concavities-/convexities are formed on a part or substantially a whole of a side wall of the first substrate.

(9)
The semiconductor device according to (8),
in which a recessed portion of the first substrate is arranged to stretch across a place where fragmentation is to be performed.

(10)
The semiconductor device according to (5),
in which an imaging element and a logic circuit are formed as the circuit in the first substrate,
a through hole for exposing a bottom surface of the first substrate and making a connection to a connection pad of the circuit is opened,
an insulating film of the first substrate is deposited,
then the connection pad is exposed,
a reinterconnection is formed,
then an insulating film unit is formed,
an interlayer insulating film of the logic circuit is opened,
then processing of recessing the interlayer insulating film of the logic circuit from a cap film is performed, and
thereby one or a plurality of concavities/convexities are formed on a part or substantially a whole of a side wall of an interconnection layer of the logic circuit.

(11)
The semiconductor device according to (10),
in which a recessed portion of the interlayer insulating film of the logic circuit is arranged to stretch across a place where fragmentation is to be performed.

(12)
A manufacturing method
in which a manufacturing apparatus forms a chip size package (CSP) composed of
a first substrate in which a circuit is formed,
a second substrate made of a material different from the first substrate, and
a bonding unit configured to bond the second substrate onto the first substrate,
in a structure in which an underfill used at a time of being mounted on a mounting substrate for mounting the CSP is prevented from adhering to a side wall of the second substrate.

(13)
An electronic device including:
a chip size package (CSP) composed of
a first substrate in which a circuit is formed,
a second substrate made of a material different from the first substrate, and
a bonding unit configured to bond the second substrate onto the first substrate; and
a mounting substrate configured to mount the CSP,
in which the CSP includes
a solid-state imaging sensor formed in a structure in which an underfill used at a time of being mounted on the mounting substrate is prevented from adhering to a side wall of the second substrate,
a signal processing circuit configured to process an output signal outputted from the solid-state imaging sensor, and
an optical system configured to cause incident light to be incident on the solid-state imaging sensor.

REFERENCE SIGNS LIST 1 solid-state imaging sensor
15 CPS
21 mounting substrate
22 Si substrate
23 adhesive
24 second substrate
25 underfill
26 chip
27 solder ball
28 space
30 cut
31 photosensitive material
32 lithography
51 CPS
61 hydrophobic material
111 CPS
120 chip
121 imaging element
122 glass substrate
123 bonding resin
124 solder ball
125 underfill
126 mounting substrate
131 Si substrate
132 insulating film
133 insulating film
134 concavity
140 insulating film
141 connection pad
143 reinterconnection
151 creeping-up prevention pattern
162 slit opening
181 slit
211 CPS
221 imaging element
222 concavity
231 slit opening
232 slit
311 CPS
321 semiconductor element
322 slit
323 interconnection layer
324 logic circuit
325 imaging element
331 bonding unit
332 interlayer film
333 cap film
500 electronic device
501 solid-state imaging sensor
502 optical lens
503 shutter device
504 driving circuit
505 signal processing circuit

The invention claimed is:
1. A semiconductor device, comprising:
a chip size package (CSP) composed of:
a first substrate in which a circuit is formed;
a second substrate made of a material different from the first substrate; and
a bonding unit configured to bond the second substrate onto the first substrate; and
a mounting substrate configured to mount the CSP,
wherein the CSP is formed in a structure in which an underfill used at a time of being mounted on the mounting substrate is prevented from adhering to a side wall of the second substrate.

2. The semiconductor device according to claim 1, wherein the underfill is prevented from adhering to a part or substantially a whole of a side wall of the CSP.

3. The semiconductor device according to claim 2, wherein a photosensitive material formed on a part or substantially a whole of the side wall of the CSP is removed and thereby the underfill is prevented from adhering to the part or substantially the whole of the side wall of the CSP.

4. The semiconductor device according to claim 2, wherein a hydrophobic material is formed on a part or substantially a whole of the side wall of the CSP and thereby the underfill is prevented from adhering to the part or substantially the whole of the side wall of the CSP.

5. The semiconductor device according to claim 1, wherein one or a plurality of concavities/convexities are formed on a part of a side wall of the first substrate and thereby the underfill is prevented from adhering to the side wall of the second substrate.

6. The semiconductor device according to claim 5,
wherein a through hole for exposing a bottom surface of the first substrate and making a connection to a connection pad of the circuit is opened,
an insulating film of the first substrate is deposited,
then the connection pad is exposed,
a reinterconnection is formed,
then a creeping-up prevention pattern is formed,
an insulating film unit is formed,
then the creeping-up prevention pattern is removed,
a concavity is formed on the insulating film unit, and
thereby the one or a plurality of concavities/convexities are formed on a part or substantially a whole of a side wall of the first substrate.

7. The semiconductor device according to claim 6, wherein the creeping-up prevention pattern is arranged to stretch across a place where fragmentation is to be performed.

8. The semiconductor device according to claim 5, wherein a through hole for exposing a bottom surface of the first substrate and making a connection to a connection pad of the circuit is opened,
an insulating film of the first substrate is deposited,
then the connection pad is exposed,
a reinterconnection is formed,
then an insulating film unit is formed,
the first substrate is opened,
then processing of recessing the first substrate is performed, and
thereby the one or a plurality of concavities-/convexities are formed on a part or substantially a whole of a side wall of the first substrate.

9. The semiconductor device according to claim 8, wherein a recessed portion of the first substrate is arranged to stretch across a place where fragmentation is to be performed.

10. The semiconductor device according to claim 5, wherein an imaging element and a logic circuit are formed as the circuit in the first substrate,
a through hole for exposing a bottom surface of the first substrate and making a connection to a connection pad of the circuit is opened,
an insulating film of the first substrate is deposited,
then the connection pad is exposed,
a reinterconnection is formed,
then an insulating film unit is formed,
an interlayer insulating film of the logic circuit is opened,
then processing of recessing the interlayer insulating film of the logic circuit from a cap film is performed, and
thereby the one or a plurality of concavities/convexities are formed on a part or substantially a whole of a side wall of an interconnection layer of the logic circuit.

11. The semiconductor device according to claim 10, wherein a recessed portion of the interlayer insulating film of the logic circuit is arranged to stretch across a place where fragmentation is to be performed.

12. An electronic device, comprising:
a chip size package (CSP) composed of:
a first substrate in which a circuit is formed;
a second substrate made of a material different from the first substrate; and
a bonding unit configured to bond the second substrate onto the first substrate; and
a mounting substrate configured to mount the CSP,
wherein the CSP includes:
a solid-state imaging sensor formed in a structure in which an underfill used at a time of being mounted on the mounting substrate is prevented from adhering to a side wall of the second substrate;
a signal processing circuit configured to process an output signal outputted from the solid-state imaging sensor; and
an optical system configured to cause incident light to be incident on the solid-state imaging sensor.

\* \* \* \* \*